US010635981B2

(12) United States Patent
Mital et al.

(10) Patent No.: US 10,635,981 B2
(45) Date of Patent: Apr. 28, 2020

(54) AUTOMATED MOVEMENT ORCHESTRATION

(71) Applicant: Microsoft Technology Licensing, LLC, Redmond, WA (US)

(72) Inventors: Vijay Mital, Kirkland, WA (US); Robin Abraham, Redmond, WA (US)

(73) Assignee: MICROSOFT TECHNOLOGY LICENSING, LLC, Redmond, WA (US)

(*) Notice: Subject to any disclaimer, the term of this patent is extended or adjusted under 35 U.S.C. 154(b) by 317 days.

(21) Appl. No.: 15/436,694

(22) Filed: Feb. 17, 2017

(65) Prior Publication Data

US 2018/0203948 A1 Jul. 19, 2018

Related U.S. Application Data

(60) Provisional application No. 62/447,817, filed on Jan. 18, 2017.

(51) Int. Cl.
*G06N 5/04* (2006.01)
*G06N 3/00* (2006.01)
(Continued)

(52) U.S. Cl.
CPC ............ *G06N 5/04* (2013.01); *G06K 9/00624* (2013.01); *G06K 9/6267* (2013.01);
(Continued)

(58) Field of Classification Search
CPC .......... G06N 5/04; G06N 3/008; G06N 5/022; G06K 9/00624; G06K 9/6267; G06K 9/6296
(Continued)

(56) References Cited

U.S. PATENT DOCUMENTS 5,093,869 A 3/1992 Alves et al.
5,617,520 A * 4/1997 Yamada ............... G06T 19/00
345/419
(Continued)

FOREIGN PATENT DOCUMENTS

CN 202887470 4/2013
EP 2141630 1/2010
(Continued)

OTHER PUBLICATIONS

Kung et al. (Efficient Location Tracking Using Sensor Networks, 2003, IEEE, pp. 1-8) (Year: 2003).*
(Continued)

*Primary Examiner* — Brian S Cook
*Assistant Examiner* — Iftekhar A Khan
(74) *Attorney, Agent, or Firm* — Workman Nydegger

(57) ABSTRACT

The automatic formulation of a plan for concurrent movement of physical entities within a physical space. A physical graph is used to formulate such a plan. The physical graph represents multiple physical entities that have been sensed in a physical space over time. A plan is then formulated based on an evaluation of that physical graph. Such plans are enabled by the semantic understanding of the physical space and its contents that the physical graph provides. The plan honors physical constraints of the physical space, and physical constraints of the physical entities that are moving within that physical space. The plan may be further orchestrated by communicating with the physical entities to provide instructions for movement. Then, movement is monitored to determine if the plan is being complied with. If the plan is not being complied with, further communications are made and/or an alternative plan is automatically constructed.

20 Claims, 8 Drawing Sheets

(51) Int. Cl.
*G06N 5/02* (2006.01)
*G06K 9/00* (2006.01)
*G06K 9/62* (2006.01)
*G06F 17/50* (2006.01)
*G06N 3/08* (2006.01)

(52) U.S. Cl.
CPC ........... *G06K 9/6296* (2013.01); *G06N 3/008* (2013.01); *G06N 5/022* (2013.01); *G06F 17/5009* (2013.01); *G06K 9/00221* (2013.01); *G06N 3/08* (2013.01)

(58) Field of Classification Search
USPC .......................................................... 703/6
See application file for complete search history.

(56) References Cited

U.S. PATENT DOCUMENTS

| | | | | |
|---|---|---|---|---|
| 5,708,767 | A | 1/1998 | Yeo et al. | |
| 5,757,424 | A | 5/1998 | Frederick | |
| 6,023,223 | A | 2/2000 | Baxter, Jr. | |
| 6,059,576 | A | 5/2000 | Brann | |
| 6,144,375 | A | 11/2000 | Jain et al. | |
| 6,188,777 | B1* | 2/2001 | Darrell | G06K 9/00362 348/169 |
| 6,278,938 | B1 | 8/2001 | Alumbaugh | |
| 6,295,367 | B1 | 9/2001 | Crabtree et al. | |
| 6,424,370 | B1* | 7/2002 | Courtney | G06K 9/00342 348/143 |
| 6,580,811 | B2 | 6/2003 | Maurer et al. | |
| 6,587,668 | B1 | 7/2003 | Miller et al. | |
| 6,590,529 | B2 | 7/2003 | Schwoegler | |
| 6,682,351 | B1 | 1/2004 | Abraham-Fuchs et al. | |
| 6,873,713 | B2 | 3/2005 | Okazaki et al. | |
| 6,882,837 | B2 | 4/2005 | Fernandez et al. | |
| 7,015,954 | B1 | 3/2006 | Foote et al. | |
| 7,084,775 | B1 | 8/2006 | Smith | |
| 7,099,745 | B2 | 8/2006 | Ebert | |
| 7,181,345 | B2 | 2/2007 | Rosenfeld et al. | |
| 7,200,266 | B2 | 4/2007 | Ozer et al. | |
| 7,359,724 | B2* | 4/2008 | Torvinen | H04W 4/021 455/456.2 |
| 7,415,675 | B2 | 8/2008 | Habon et al. | |
| 7,647,166 | B1 | 1/2010 | Kerns | |
| 7,650,058 | B1 | 1/2010 | Garoutte | |
| 7,717,827 | B2 | 5/2010 | Kurunmaki et al. | |
| 7,725,830 | B2 | 5/2010 | Vronay | |
| 7,760,878 | B2 | 7/2010 | Fukushima | |
| 7,765,265 | B1 | 7/2010 | Granito et al. | |
| 7,788,203 | B2 | 8/2010 | Friedlander et al. | |
| 7,823,056 | B1 | 10/2010 | Davey et al. | |
| 7,865,300 | B2* | 1/2011 | Seacat | G01C 21/3438 180/167 |
| 7,872,573 | B2 | 1/2011 | Lamb | |
| 7,929,017 | B2 | 4/2011 | Aggarwal et al. | |
| 8,018,333 | B2 | 9/2011 | Sennett et al. | |
| 8,081,822 | B1* | 12/2011 | Bell | G06F 3/017 345/157 |
| 8,149,278 | B2* | 4/2012 | Wren | H04N 7/18 348/143 |
| 8,150,155 | B2 | 4/2012 | El-Maleh et al. | |
| 8,184,154 | B2 | 5/2012 | Estevez et al. | |
| 8,274,564 | B2 | 9/2012 | Girgensohn et al. | |
| 8,275,361 | B2 | 9/2012 | De Vries | |
| 8,311,275 | B1 | 11/2012 | Berlic et al. | |
| 8,401,252 | B2 | 3/2013 | Schneiderman et al. | |
| 8,467,715 | B2 | 6/2013 | Morita et al. | |
| 8,655,020 | B2* | 2/2014 | Saptharishi | H04N 7/181 382/103 |
| 8,660,518 | B2 | 2/2014 | Sennett et al. | |
| 8,688,434 | B1 | 4/2014 | Birnbaum et al. | |
| 8,789,133 | B2 | 7/2014 | Kuhlke et al. | |
| 8,812,499 | B2 | 8/2014 | Sathish et al. | |
| 8,812,960 | B1 | 8/2014 | Sun et al. | |
| 8,818,929 | B2 | 8/2014 | Fraboulet-Laudy et al. | |
| 8,825,377 | B2* | 9/2014 | Callaghan | G01C 21/20 701/416 |
| 8,832,121 | B2 | 9/2014 | Smith et al. | |
| 8,929,601 | B2 | 1/2015 | Caulfield | |
| 8,934,717 | B2 | 1/2015 | Newell et al. | |
| 8,942,536 | B2 | 1/2015 | Herz | |
| 8,958,912 | B2* | 2/2015 | Blumberg | B25J 9/0087 700/259 |
| 9,002,098 | B1 | 4/2015 | Chelian et al. | |
| 9,015,256 | B1 | 4/2015 | Zimmers et al. | |
| 9,026,367 | B2* | 5/2015 | Paek | G01C 21/3438 701/533 |
| 9,124,800 | B2 | 9/2015 | Chou et al. | |
| 9,140,555 | B1* | 9/2015 | Andersson | H04W 4/38 |
| 9,154,561 | B2* | 10/2015 | Oh | H04L 12/1818 |
| 9,222,793 | B2* | 12/2015 | Shin | G08G 1/096816 |
| 9,237,199 | B2 | 1/2016 | Jennings et al. | |
| 9,260,122 | B2 | 2/2016 | Haas et al. | |
| 9,280,911 | B2 | 3/2016 | Sadeh-Koniecpol et al. | |
| 9,300,912 | B2 | 3/2016 | Taneja et al. | |
| 9,317,813 | B2* | 4/2016 | McGavran | G01C 21/3617 |
| 9,574,887 | B2* | 2/2017 | Ahn | G06Q 50/30 |
| 9,857,195 | B2* | 1/2018 | Foster | G01C 21/3682 |
| 10,078,855 | B2* | 9/2018 | Miller | G06F 17/2785 |
| 10,339,455 | B1* | 7/2019 | Parush-Tzur | G06N 20/20 |
| 2002/0091793 | A1 | 7/2002 | Sagie | |
| 2003/0046592 | A1 | 3/2003 | Woodruff | |
| 2004/0177253 | A1 | 9/2004 | Wu et al. | |
| 2004/0197752 | A1 | 10/2004 | Hall et al. | |
| 2004/0267446 | A1* | 12/2004 | Minato | G01C 21/26 701/410 |
| 2005/0018045 | A1 | 1/2005 | Thomas et al. | |
| 2005/0209849 | A1 | 9/2005 | Abrego et al. | |
| 2005/0222764 | A1* | 10/2005 | Uyeki | G01C 21/3415 701/414 |
| 2006/0106743 | A1* | 5/2006 | Horvitz | G08G 1/0104 706/21 |
| 2007/0100539 | A1* | 5/2007 | Jang | G01C 21/362 701/423 |
| 2007/0110290 | A1* | 5/2007 | Chang | G06T 5/001 382/128 |
| 2007/0168118 | A1* | 7/2007 | Lappe | G01C 21/005 701/408 |
| 2007/0168864 | A1 | 7/2007 | Yamamoto et al. | |
| 2008/0114528 | A1 | 5/2008 | Seacat et al. | |
| 2008/0178232 | A1 | 7/2008 | Velusamy | |
| 2008/0252725 | A1 | 10/2008 | Lanfermann et al. | |
| 2008/0268418 | A1 | 10/2008 | Tashner et al. | |
| 2008/0292140 | A1* | 11/2008 | Morris | G06K 9/00295 382/103 |
| 2008/0298549 | A1 | 12/2008 | Quill et al. | |
| 2009/0024868 | A1* | 1/2009 | Joshi | G06F 9/5088 714/4.4 |
| 2009/0055019 | A1* | 2/2009 | Stiehl | B25J 9/1671 700/249 |
| 2009/0143079 | A1* | 6/2009 | Klassen | G01C 21/20 455/456.3 |
| 2009/0153654 | A1 | 6/2009 | Enge et al. | |
| 2009/0164397 | A1 | 6/2009 | Kwok | |
| 2010/0081957 | A1 | 4/2010 | Hyde et al. | |
| 2010/0156715 | A1* | 6/2010 | Kang | G01S 5/0072 342/357.25 |
| 2010/0161210 | A1* | 6/2010 | Watkins | G01C 21/20 701/533 |
| 2010/0232646 | A1 | 9/2010 | Takeuchi | |
| 2010/0241346 | A1* | 9/2010 | Waris | G01C 21/20 701/533 |
| 2010/0256852 | A1* | 10/2010 | Mudalige | G08G 1/163 701/24 |
| 2010/0312476 | A1* | 12/2010 | Mueller | G01C 21/3438 701/302 |
| 2011/0137552 | A1* | 6/2011 | Chang | G01C 21/3415 701/533 |
| 2011/0238755 | A1 | 9/2011 | Khan et al. | |
| 2012/0052870 | A1* | 3/2012 | Habicher | H04W 8/16 455/456.1 |

(56) References Cited

U.S. PATENT DOCUMENTS

| | | | |
|---|---|---|---|
| 2012/0084669 A1 | 4/2012 | Flint et al. | |
| 2012/0133638 A1* | 5/2012 | Davison | G06T 17/00 345/419 |
| 2012/0144318 A1 | 6/2012 | Khadilkar et al. | |
| 2012/0166469 A1 | 6/2012 | Cammert et al. | |
| 2012/0239584 A1* | 9/2012 | Yariv | G01C 21/3438 705/319 |
| 2012/0257876 A1 | 10/2012 | Gupta et al. | |
| 2012/0320013 A1 | 12/2012 | Perez et al. | |
| 2013/0060632 A1 | 3/2013 | Gadhia et al. | |
| 2013/0085663 A1 | 4/2013 | Hsieh | |
| 2013/0169834 A1 | 7/2013 | Herz et al. | |
| 2014/0005941 A1* | 1/2014 | Paek | G01C 21/3438 701/533 |
| 2014/0136186 A1 | 5/2014 | Adami et al. | |
| 2014/0140639 A1 | 5/2014 | Wang et al. | |
| 2014/0214384 A1* | 7/2014 | Kawahito | G06F 17/5009 703/6 |
| 2014/0233919 A1 | 8/2014 | Sabatino | |
| 2014/0244834 A1 | 8/2014 | Guedalia et al. | |
| 2014/0266669 A1 | 9/2014 | Fadell et al. | |
| 2014/0316570 A1 | 10/2014 | Sun et al. | |
| 2014/0375425 A1 | 12/2014 | Gupta et al. | |
| 2015/0006695 A1 | 1/2015 | Gupta | |
| 2015/0019714 A1 | 1/2015 | Shaashua et al. | |
| 2015/0100979 A1 | 4/2015 | Moskowitz et al. | |
| 2015/0134739 A1 | 5/2015 | Gibbon et al. | |
| 2015/0168169 A1 | 6/2015 | Caceres et al. | |
| 2015/0169763 A1 | 6/2015 | Damman et al. | |
| 2015/0219458 A1* | 8/2015 | Shah | G01C 21/00 701/522 |
| 2015/0244969 A1 | 8/2015 | Fisher et al. | |
| 2015/0278263 A1 | 10/2015 | Bowles et al. | |
| 2015/0279226 A1 | 10/2015 | Harrison et al. | |
| 2015/0296177 A1 | 10/2015 | Pinter et al. | |
| 2016/0035391 A1 | 2/2016 | Ross et al. | |
| 2016/0044298 A1 | 2/2016 | Holz et al. | |
| 2016/0055422 A1 | 2/2016 | Li | |
| 2016/0073482 A1 | 3/2016 | Fok et al. | |
| 2016/0086490 A1 | 3/2016 | Ando | |
| 2016/0095013 A1 | 3/2016 | Faivishevsky et al. | |
| 2016/0195859 A1 | 7/2016 | Britt et al. | |
| 2016/0227371 A1 | 8/2016 | Wang et al. | |
| 2018/0202819 A1* | 7/2018 | Mital | G06N 5/022 |
| 2018/0214768 A1* | 8/2018 | Macri | A63F 13/212 |

FOREIGN PATENT DOCUMENTS

| | | |
|---|---|---|
| JP | 2011170789 A | 9/2011 |
| WO | 9906940 A1 | 2/1999 |
| WO | 2010086680 | 8/2010 |
| WO | 2011055309 A1 | 5/2011 |
| WO | 2015069124 | 5/2015 |
| WO | 2015094237 A1 | 6/2015 |

OTHER PUBLICATIONS

Abid et al. ("V-Cloud: Vehicular Cyber-Physical Systems and Cloud Computing", ACM, 2011, pp. 1-6) (Year: 2011).*

Alam et al. ("Toward Social Internet of Vehicles: Concept, Architecture, and Applications", IEEE, 2015 pp. 343-357) (Year: 2015).*

Colla et al. ("Modelling and Simulation of an Automated Warehouse for the Comparison of Storage Strategy", Modelling Simulation and Optimization, 2010, pp. 471-486) (Year: 2010).*

Alam et al. ("Toward Social Internet of Vehicles: Concept, Architecture, and Applications", IEEE, 2015 pp. 343-357) (Year: 2015).*

Kung et al. ("Efficient Location Tracking Using Sensor Networks" IEEE, 2003, pp. 1-8) (Year: 2003).*

Gonzalez et al. ("Warehousing and Analyzing Massive RFID Data Sets", ICDE, 2006, pp. 1 -10) (Year: 2006).*

Colla et al. ("Modelling and Simulation of an Automated Warehouse for the comparison of Storage Strategies ", Modelling Simulations and Optimization, 2010) (Year: 2010).*

"Google Announces Launch of Google Maps for Mobile With "My Location" Technology—News announcements—News from Google—Google", Retrieved from http://googlepress.blogspot.com/2007/11/google-announces-launch-of-google-maps_28.html, Nov. 28, 2007, 2 Pages.

"International Search Report and Written Opinion Issued in PCT Application No. PCT/US2018/013424", dated Apr. 9, 2018, 14 Pages.

Smuts, et al., "Using Discrete AI Techniques for Designing a Real-World Control Supervisor", In Annual Review in Automatic Programming, vol. 15, Jan. 1, 1989, pp. 31-35.

Wright, Maury, "Neural Networks Tackle Real-World Problems", In Electrical Design News, vol. 35, No. 23, Nov. 8, 1990, 8 Pages.

Ni, et al., "Object Browsing and Searching in a Camera Network using Graph Models", In Proceedings of IEEE Computer Society Conference on Computer Vision and Pattern Recognition Workshops, Jun. 16, 2012, pp. 7-14.

Katz, et al., "Answering Questions about Moving Objects in Surveillance Videos", In Proceedings of AAAI Spring Symposium on New Directions in Question Answering, Mar. 2003, 8 pages.

Codreanu, et al., "Mobile objects and sensors within a video surveillance system: Spatio-temporal model and queries", In Proceedings of International Workshop on Information Management in Mobile Applications, Aug. 2013, pp. 52-59.

Larusso, et al., "Efficient Tracking and Querying for Coordinated Uncertain Mobile Objects", In Proceedings of IEEE 29th International Conference on Data Engineering, Apr. 8, 2013, 12 pages.

Kung, et al., "Efficient Location Tracking Using Sensor Networks", In Proceedings of IEEE Wireless Communications and Networking Conference, Mar. 16, 2003, 8 pages.

Gehrke, et al., "Query Processing in Sensor Networks", In Proceedings of IEEE Pervasive computing, vol. 3, Issue 1, Jan. 2004, pp. 46-55.

Green, et al., "Human robot collaboration: An augmented reality approach a literature review and analysis", In proceedings of 3rd International Conference on Mechatronics and Embedded Systems and Applications, Sep. 4, 2007, pp. 1-10.

Guizzo, Erico, "Superfast Robotic Camera Mimics Human Eye", Published on: Nov. 1, 2010 Available at: http://spectrum.ieee.org/automaton/robotics/industrial-robots/superfast-robotic-camera-mimics-human-eye.

Weverbergh, Raf, "A robot brain in the cloud: RoboEarth", Retrieved on: Aug. 4, 2016 Available at: http://www.whiteboardmag.com/a-robot-brain-in-the-cloud-roboearth/.

Ackerman, Evan, "MIT's Augmented Reality Room Shows What Robots are Thinking", Published on: Nov. 5, 2014 Available at:http://spectrum.ieee.org/automaton/robotics/artificial-intelligence/mit-augmented-reality-room-shows-what-robots-are-thinking.

"The LIAA framework at a glance", Retrieved on: Aug. 4, 2016. Available at: http://www.project-leanautomation.eu/index.php?id=60&tx_ttnews%5Bpointer%5D=4&cHash=5a8866d486adeb0ab0da2cfb330974a1.

Holz, et al., "Where Robots and Virtual Agents Meet: A Survey of Social Interaction Research across Milgram's Reality-Virtuality Continuum", In International Journal of Social Robotics, vol. 1, Issue 1, Jan. 2009, pp. 1-12.

Wada, et al., "Task learning for a real robot by using virtual space", In Proceedings of IEEE International Joint Conference on Neural Network, Jul. 16, 2006, pp. 2491-2496.

Secher, Kristian, "Memory makes robots more competitive", Published on: Feb. 24, 2013 Available at: http://sciencenordic.com/memory-makes-robots-more-competitive.

Kelley, et al., "Understanding Activities and Intentions for Human-Robot Interaction", In Publication of INTECH Open Access Publisher, Feb. 1, 2010, pp. 1-18.

M. Reardon, Christopher, "An Intelligent Robot and Augmented Reality Instruction System", In Doctoral Dissertations of University of Tennessee, May 2016, 173 pages.

"Robot intuition: predicting your next move!", Published on: Mar. 15, 2015 Available at:http://www.technologist.eu/robot-intuition/.

Jenkins, et al., "Tracking Human Motion and Actions for Interactive Robots", In proceedings of International Conference on Human Robot Interaction, Mar. 10, 2007, 8 pages.

(56) References Cited

OTHER PUBLICATIONS

Siau, et al., "Mobile commerce: Promises, challenges, and research agenda", In Journal of Database Management, vol. 12, Issue 3, Jul. 2001, pp. 4-13.

Yu, et al., "A New Framework of Moving Target Detection and Tracking for Uav Video Application", In International Archives of the Photogrammetry, Remote Sensing and Spatial Information Sciences, vol. XXXVII, Part B3b, 2008, pp. 609-614.

Radke, et al., "Image Change Detection Algorithms: A Systematic Survey", http://www.ecse.rpiscrews.us/~rjradke/papers/radketip04.pdf, Published on: Aug. 19, 2004, 1-32 pages.

"Camera", Retrieved on: Aug. 5, 2016 Available at:https://docs.unrealengine.com/latest/INT/Gameplay/Framework/Camera/.

Marraud, et al., "Semantic Browsing of Video Surveillance Databases through Online Generic Indexing", In Proceedings of Third ACM/IEEE International Conference on Distributed Smart Cameras, Aug. 30, 2009, 8 pages.

Ohno, et al., "Tracking Players and Estimation of the 3D Position of a Ball in Soccer Games", In Proceedings of the International Conference on Pattern Recognition, vol. 1, Sep. 3, 2000, pp. 145-148.

Arman, et al., "Content-based Browsing of Video Sequences", In Proceedings of the second ACM International Conference on Multimedia, Oct. 15, 1994, pp. 97-103.

Plestina, et al., "A modular system for tracking players in sports games", In International Journal of Education and Information Technologies, Issue 4, vol. 3, Jan. 1, 2009, pp. 197-204.

Bertinoy, et al., "An Access Control Model for Video Database Systems", In Proceedings of the ninth international conference on Information and knowledge management, Nov. 6, 2000, pp. 336-343.

McKenna, et al., "Virtual Group Dynamics", In Journal of Group Dynamics: Theory, Research, and Practice, vol. 6, No. 1, Mar. 2002, pp. 116-127.

Herbsleb, et al., "Introducing Instant Messaging and Chat in the Workplace", In Proceedings of Human Factors in Computing Systems, vol. 4, Issue 1, Apr. 20, 2002, pp. 171-178.

Aziz, Hussein Muzahim, "Streaming Video over Unreliable and Bandwidth Limited Networks", In Doctoral Dissertation of Blekinge Institute of Technology, Retrieved on: Aug. 9, 2016, 210 pages.

Rothkrantz, et al., "Personal Mobile Intelligent Travelling Assistance System", Published on: May 24, 2005. Available at: http://mmi.tudelft.nl/pub/bogdan/Personal%20Mobile%20Intelligent%20Travelling%20Assistance%20System.pdf.

Tsoneva, et al., "Automated summarization of narrative video on a semantic level", In Proceedings of International Conference on Semantic Computing, Sep. 17, 2007, pp. 169-176.

Hospedales, et al., "Learning Tags from Unsegmented Videos of Multiple Human Actions", In Proceedings of IEEE 11th International Conference on Data Mining, Dec. 11, 2011, 9 pages.

"Turn your presentation into a video", Published on: Sep. 19, 2015 Available at: https://support.office.com/en-us/article/Turn-your-presentation-into-a-video-c140551f-cb37-4818-b5d4-3e30815c3e83.

Bao, et al., "Activity Recognition from User-Annotated Acceleration Data", In Proceedings of International Conference on Pervasive Computing, Apr. 21, 2004, pp. 1-17.

Hong, et al., "Key-Device based place recognition using similarity measure between IoT spaces", In Proceedings of IEEE International Conference on Smart Computing, May 18, 2016, 5 pages.

Shemshadi, et al., "ThingSeek: A Crawler and Search Engine for the Internet of Things", In Proceedings of the 39th International ACM SIGIR conference on Research and Development in Information Retrieval, Jul. 17, 2016, pp. 1149-1152.

Alam, et al., "Toward Social Internet of Vehicles: Concept, Architecture, and Applications", In Journal of IEEE Access, vol. 3, Mar. 25, 2015, pp. 343-357.

\* cited by examiner

AUTOMATED MOVEMENT ORCHESTRATION

CROSS-REFERENCE TO RELATED APPLICATIONS

This application claims the benefit of U.S. Provisional application 62/447,817 filed Jan. 18, 2017, titled "AUTOMATED MOVEMENT ORCHESTRATION", which is incorporated herein by reference in its entirety.

BACKGROUND

Computing systems and associated networks have greatly revolutionized our world. At first, computing systems were only able to perform simple tasks. However, as processing power has increased and become increasingly available, the complexity of tasks performed by a computing system has greatly increased. Likewise, the hardware complexity and capability of computing systems has greatly increased, as exemplified with cloud computing that is supported by large data centers.

For a long period of time, computing systems just did essentially what they were told by their instructions or software. However, software and the employment of hardware is becoming so advanced that computing systems are now, more than ever before, capable of some level of decision making at higher levels. At present, in some respects, the level of decision making can approach, rival, or even exceed the capability of the human brain to make decisions. In other words, computing systems are now capable of employing some level of artificial intelligence.

One example of artificial intelligence is the recognition of external stimuli from the physical world. For instance, voice recognition technology has improved greatly allowing for high degree of accuracy in detecting words that are being spoken, and even the identity of the person that is speaking. Likewise, computer vision allows computing systems to automatically identify objects within a particular picture or frame of video, or recognize human activity across a series of video frames. As an example, face recognition technology allows computing systems to recognize faces, and activity recognition technology allows computing systems to know whether two proximate people are working together.

Each of these technologies may employ deep learning (Deep Neural Network-based and reinforcement-based learning mechanisms) and machine learning algorithms to learn from experience what is making a sound, and objects or people that are within an image, thereby improving accuracy of recognition over time. In the area of recognizing objects within a more complex imaged scene with large numbers of visual distractions, advanced computer vision technology now exceeds the capability of a human being to quickly and accurately recognize objects of interest within that scene. Hardware, such as matrix transformation hardware in conventional graphical processing units (GPUs), may also contribute to the rapid speed in object recognition in the context of deep neural networks.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

At least some embodiments described herein relate to the automatic formulation of a plan for concurrent movement of physical entities within a physical space. A physical graph is used to formulate such a plan. The physical graph represents multiple physical entities that have been sensed in a physical space over time. A plan is then formulated based on an evaluation of that physical graph. Such plans are enabled by the semantic understanding of the physical space and its contents that the physical graph provides. The plan honors physical constraints of the physical space, and physical constraints of the physical entities that are moving within that physical space.

In accordance with some embodiments, the plan is further orchestrated by communicating with the physical entities to provide instructions for movement. Then, movement is monitored to determine if the plan is being complied with. If the plan is not being complied with, further communications are made and/or an alternative plan is automatically constructed. This may be repeated such that there is constant automated orchestration of movements within the physical space.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

Figure 1:
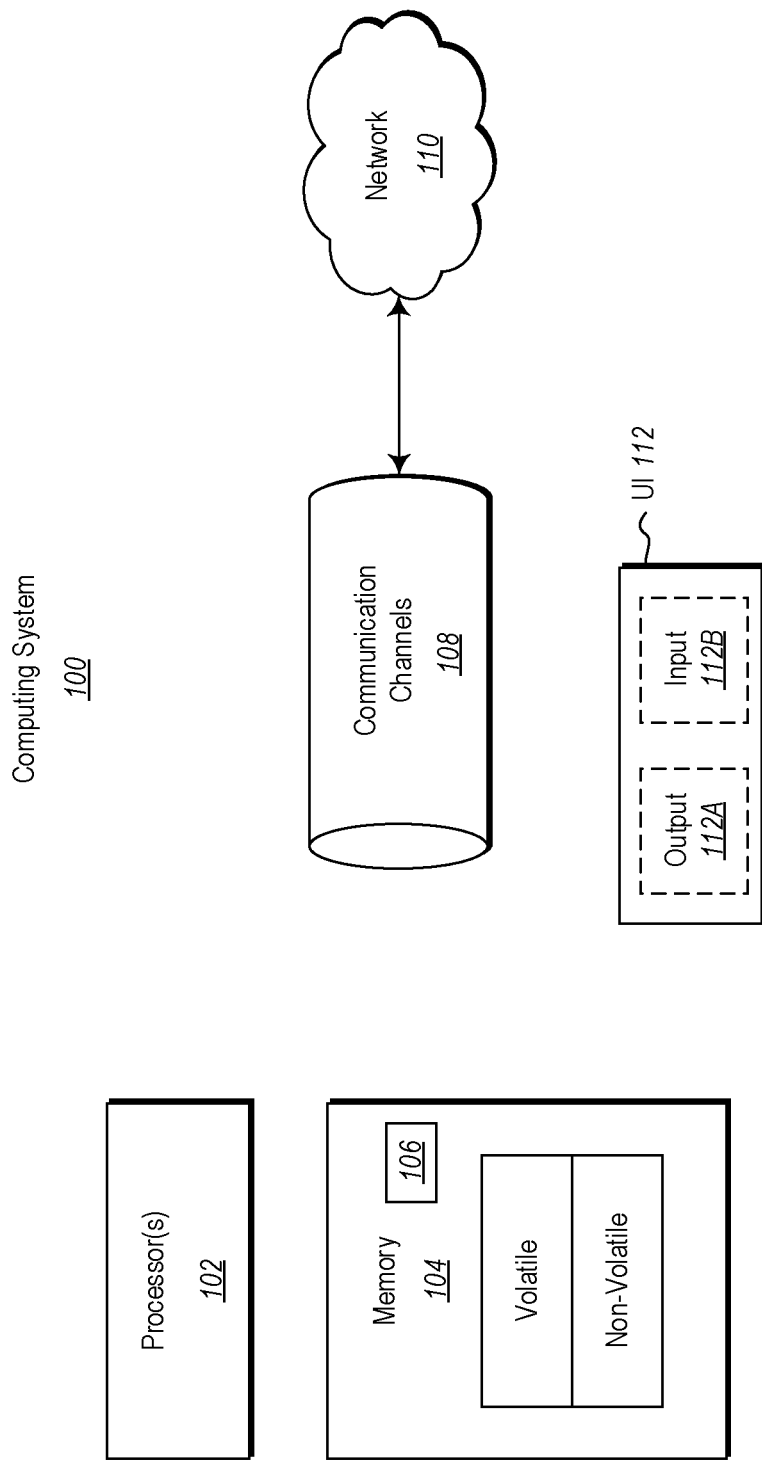
FIG. 1 illustrates an example computer system in which the principles described herein may be employed.

At least some embodiments described herein relate to the automatic formulation of a plan for concurrent movement of physical entities within a physical space. A physical graph is used to formulate such a plan. The physical graph represents multiple physical entities that have been sensed in a physical space over time. A plan is then formulated based on an evaluation of that physical graph. Such plans are enabled by the semantic understanding of the physical space and its contents that the physical graph provides. The plan honors physical constraints of the physical space, and physical constraints of the physical entities that are moving within that physical space.

In accordance with some embodiments, the plan is further orchestrated by communicating with the physical entities to provide instructions for movement. Then, movement is monitored to determine if the plan is being complied with. If the plan is not being complied with, further communications are made and/or an alternative plan is automatically constructed. This may be repeated such that there is constant automated orchestration of movements within the physical space.

Because the principles described herein operate in the context of a computing system, a computing system will be described with respect to FIG. 1. Then, the principles of the foundation upon which ambient computing may be performed in the context of a computer-navigable graph (also called herein a "physical graph") will then be described with respect to FIGS. 2 through 4. The obtaining of signal segments from the physical graph will then be described with respect to FIG. 5. Thereafter, the application of security in the context of ambient computing will be described with respect to FIG. 6. The managing of the size of the computer-navigable graph will be described with respect to FIG. 7. Then, the sharing of signal segments from the physical graph will then be described with respect to FIG. 8. Finally, two related planning and routing implementations that use the semantic understanding provided by the physical graph will be described with respect to FIGS. 9 and 10.

Computing systems are now increasingly taking a wide variety of forms. Computing systems may, for example, be handheld devices, appliances, laptop computers, desktop computers, mainframes, distributed computing systems, datacenters, or even devices that have not conventionally been considered a computing system, such as wearables (e.g., glasses, watches, bands, and so forth). In this description and in the claims, the term "computing system" is defined broadly as including any device or system (or combination thereof) that includes at least one physical and tangible processor, and a physical and tangible memory capable of having thereon computer-executable instructions that may be executed by a processor. The memory may take any form and may depend on the nature and form of the computing system. A computing system may be distributed over a network environment and may include multiple constituent computing systems.

As illustrated in FIG. 1, in its most basic configuration, a computing system 100 typically includes at least one hardware processing unit 102 and memory 104. The memory 104 may be physical system memory, which may be volatile, non-volatile, or some combination of the two. The term "memory" may also be used herein to refer to non-volatile mass storage such as physical storage media. If the computing system is distributed, the processing, memory and/or storage capability may be distributed as well.

The computing system 100 has thereon multiple structures often referred to as an "executable component". For instance, the memory 104 of the computing system 100 is illustrated as including executable component 106. The term "executable component" is the name for a structure that is well understood to one of ordinary skill in the art in the field of computing as being a structure that can be software, hardware, or a combination thereof. For instance, when implemented in software, one of ordinary skill in the art would understand that the structure of an executable component may include software objects, routines, methods that may be executed on the computing system, whether such an executable component exists in the heap of a computing system, or whether the executable component exists on computer-readable storage media.

In such a case, one of ordinary skill in the art will recognize that the structure of the executable component exists on a computer-readable medium such that, when interpreted by one or more processors of a computing system (e.g., by a processor thread), the computing system is caused to perform a function. Such structure may be computer-readable directly by the processors (as is the case if the executable component were binary). Alternatively, the structure may be structured to be interpretable and/or compiled (whether in a single stage or in multiple stages) so as to generate such binary that is directly interpretable by the processors. Such an understanding of example structures of an executable component is well within the understanding of one of ordinary skill in the art of computing when using the term "executable component".

The term "executable component" is also well understood by one of ordinary skill as including structures that are implemented exclusively or near-exclusively in hardware, such as within a field programmable gate array (FPGA), an application specific integrated circuit (ASIC), or any other specialized circuit. Accordingly, the term "executable component" is a term for a structure that is well understood by those of ordinary skill in the art of computing, whether implemented in software, hardware, or a combination. In this description, the term "component" may also be used. As used in this description and in the case, this term (regardless of whether the term is modified with one or more modifiers) is also intended to be synonymous with the term "executable component" or be specific types of such an "executable component", and thus also have a structure that is well understood by those of ordinary skill in the art of computing.

In the description that follows, embodiments are described with reference to acts that are performed by one or more computing systems. If such acts are implemented in software, one or more processors (of the associated computing system that performs the act) direct the operation of the computing system in response to having executed computer-executable instructions that constitute an executable component. For example, such computer-executable instructions may be embodied on one or more computer-readable media that form a computer program product. An example of such an operation involves the manipulation of data.

The computer-executable instructions (and the manipulated data) may be stored in the memory 104 of the computing system 100. Computing system 100 may also contain communication channels 108 that allow the computing system 100 to communicate with other computing systems over, for example, network 110.

While not all computing systems require a user interface, in some embodiments, the computing system 100 includes a user interface 112 for use in interfacing with a user. The user interface 112 may include output mechanisms 112A as well as input mechanisms 112B. The principles described herein are not limited to the precise output mechanisms 112A or input mechanisms 112B as such will depend on the nature of the device. However, output mechanisms 112A might include, for instance, speakers, displays, tactile output, holograms, virtual reality, and so forth. Examples of input mechanisms 112B might include, for instance, microphones, touchscreens, holograms, virtual reality, cameras, keyboards, mouse of other pointer input, sensors of any type, and so forth.

Embodiments described herein may comprise or utilize a special purpose or general-purpose computing system including computer hardware, such as, for example, one or more processors and system memory, as discussed in greater detail below. Embodiments described herein also include physical and other computer-readable media for carrying or storing computer-executable instructions and/or data structures. Such computer-readable media can be any available media that can be accessed by a general purpose or special purpose computing system. Computer-readable media that store computer-executable instructions are physical storage media. Computer-readable media that carry computer-executable instructions are transmission media. Thus, by way of example, and not limitation, embodiments can comprise at least two distinctly different kinds of computer-readable media: storage media and transmission media.

Computer-readable storage media includes RAM, ROM, EEPROM, CD-ROM or other optical disk storage, magnetic disk storage or other magnetic storage devices, or any other physical and tangible storage medium which can be used to store desired program code means in the form of computer-executable instructions or data structures and which can be accessed by a general purpose or special purpose computing system.

A "network" is defined as one or more data links that enable the transport of electronic data between computing systems and/or modules and/or other electronic devices. When information is transferred or provided over a network or another communications connection (either hardwired, wireless, or a combination of hardwired or wireless) to a computing system, the computing system properly views the connection as a transmission medium. Transmissions media can include a network and/or data links which can be used to carry desired program code means in the form of computer-executable instructions or data structures and which can be accessed by a general purpose or special purpose computing system. Combinations of the above should also be included within the scope of computer-readable media.

Further, upon reaching various computing system components, program code means in the form of computer-executable instructions or data structures can be transferred automatically from transmission media to storage media (or vice versa). For example, computer-executable instructions or data structures received over a network or data link can be buffered in RAM within a network interface module (e.g., a "NIC"), and then eventually transferred to computing system RAM and/or to less volatile storage media at a computing system. Thus, it should be understood that readable media can be included in computing system components that also (or even primarily) utilize transmission media.

Computer-executable instructions comprise, for example, instructions and data which, when executed at a processor, cause a general purpose computing system, special purpose computing system, or special purpose processing device to perform a certain function or group of functions. Alternatively, or in addition, the computer-executable instructions may configure the computing system to perform a certain function or group of functions. The computer executable instructions may be, for example, binaries or even instructions that undergo some translation (such as compilation) before direct execution by the processors, such as intermediate format instructions such as assembly language, or even source code.

Those skilled in the art will appreciate that the invention may be practiced in network computing environments with many types of computing system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, datacenters, wearables (such as glasses or watches) and the like. The invention may also be practiced in distributed system environments where local and remote computing systems, which are linked (either by hardwired data links, wireless data links, or by a combination of hardwired and wireless data links) through a network, both perform tasks. In a distributed system environment, program modules may be located in both local and remote memory storage devices.

Those skilled in the art will also appreciate that the invention may be practiced in a cloud computing environment. Cloud computing environments may be distributed, although this is not required. When distributed, cloud computing environments may be distributed internationally within an organization and/or have components possessed across multiple organizations. In this description and the following claims, "cloud computing" is defined as a model for enabling on-demand network access to a shared pool of configurable computing resources (e.g., networks, servers, storage, applications, and services). The definition of "cloud computing" is not limited to any of the other numerous advantages that can be obtained from such a model when properly deployed.

For instance, cloud computing is currently employed in the marketplace so as to offer ubiquitous and convenient on-demand access to the shared pool of configurable computing resources. Furthermore, the shared pool of configurable computing resources can be rapidly provisioned via virtualization and released with low management effort or service provider interaction, and then scaled accordingly.

A cloud computing model can be composed of various characteristics such as on-demand self-service, broad network access, resource pooling, rapid elasticity, measured service, and so forth. A cloud computing model may also come in the form of various service models such as, for example, Software as a Service ("SaaS"), Platform as a Service ("PaaS"), and Infrastructure as a Service ("IaaS"). The cloud computing model may also be deployed using different deployment models such as private cloud, community cloud, public cloud, hybrid cloud, and so forth. In this description and in the claims, a "cloud computing environment" is an environment in which cloud computing is employed.

Figure 2:
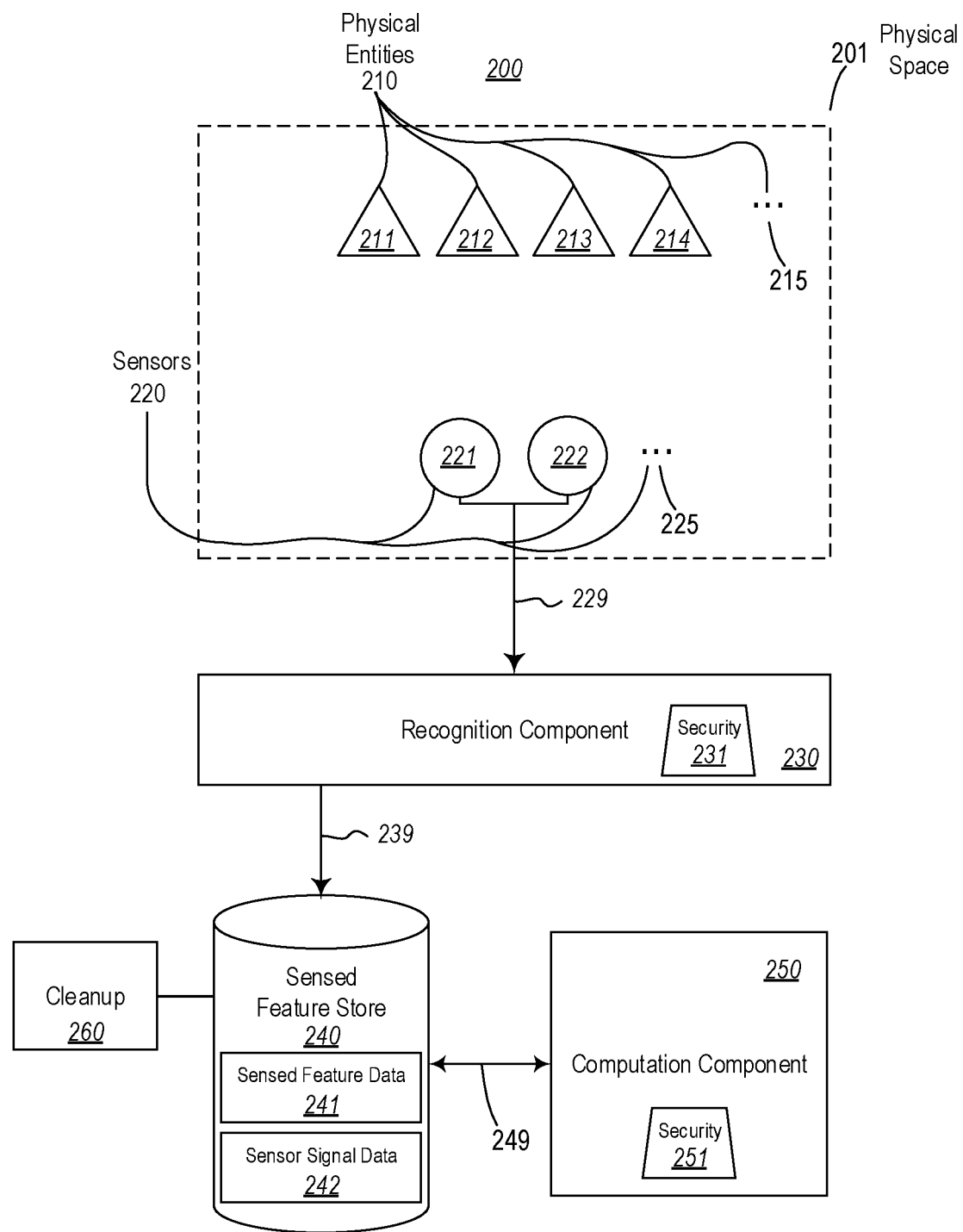
FIG. 2 illustrates an environment in which the principles described herein may operate, which includes a physical space that includes multiple physical entities and multiple sensors, a recognition component that senses features of physical entities within the physical space, and a feature store that stores sensed features of such physical entities, such that computation and querying may be performed against those features.

FIG. 2 illustrates an environment 200 in which the principles described herein may operate. The environment 200 includes a physical space 201 (also potentially referred to as a "physical space") that includes multiple physical entities 210, which may be any extant object, person, or thing that emits or reflects physical signals (such as electromagnetic radiation or acoustics) that has a pattern that may be used to potentially identify one or more physical features (also called herein states) of the respective object, person, or thing. An example of such potentially identifying electromagnetic radiation is visible light that has a light pattern (e.g., a still image or video) from which characteristics of visible entities may be ascertained. Such light pattern may be any temporal, spatial, or even higher-dimensional space. An example of such acoustics may the voice of a human being, the sound of an object in normal operation or undergoing an activity or event, or a reflected acoustic echo.

The environment 200 also includes sensors 220 that receive physical signals from the physical entities 210. The sensors need not, of course, pick up every physical signal that the physical entity emits or reflects. For instance, a visible light camera (still or video) is capable of receiving electromagnetic radiation in the form of visible light and converting such signals into processable form, but cannot pick up all electromagnetic radiation of any frequency since cameras all have a finite dynamic range. Acoustic sensors likewise have limited dynamic range designed for certain frequency ranges. In any case, the sensors 220 provide (as represented by arrow 229) resulting sensor signals to a recognition component 230.

The recognition component 230 at least estimates (e.g., estimates or recognizes) one or more features of the physical entities 210 within the location based on patterns detected in the received sensor signals. The recognition component 230 may also generate a confidence level associated with the "at least an estimation" of a feature of the physical entity. If that confidence level is less than 100%, then the "at least an estimation" is just an estimation. If that confidence level is 100%, then the "at least an estimation" is really more than an estimation—it is a recognition. In the remainder of this description and in the claims, a feature that is "at least estimated" will also be referred to as a "sensed" feature to promote clarity. This is consistent with the ordinary usage of the term "sense" since a feature that is "sensed" is not always present with complete certainty. The recognition component 230 may employ deep learning (Deep Neural Network-based and reinforcement-based learning mechanisms) and machine learning algorithms to learn from experience what objects or people that are within an image, thereby improving accuracy of recognition over time.

The recognition component 230 provides (as represented by arrow 239) the sensed features into a sensed feature store 240, which can store the sensed features (and associated confidence levels) for each physical entity within the location 201, whether the physical entity is within the physical space for a short time, a long time, or permanently. The computation component 250 may then perform a variety of queries and/or computations on the sensed feature data provided in sensed feature store 240. The queries and/or computations may be enabled by interactions (represented by arrow 249) between the computation component 250 and the sensed feature store 240.

In some embodiments, when the recognition component 230 senses a sensed feature of a physical entity within the location 201 using sensor signal(s) provided by a sensor, the sensor signals are also provided to a store, such as the sensed feature store. For instance, in FIG. 2, the sensed feature store 240 is illustrated as including sensed features 241 as well as the corresponding sensor signals 242 that represent the evidence of the sense features.

For at least one (and preferably many) of the sensed features for at least one of the sensed plurality of entities, at least one signal segment is computer-associated with the sensed feature such that computer-navigation to the sensed feature also allows for computer-navigation to the signal segment. The association of the sensed signal with the associated signal segment may be performed continuously, thus resulting in an expanding graph, and an expanding collection of signal segments. That said, as described further below, garbage collection processes may be used to clean up sensed features and/or signal segments that are outdated or no longer of interest.

The signal segment may include multiple pieces of metadata such as, for instance, an identification of the sensor or sensors that generated the signal segment. The signal segment need not include all of the signals that were generated by that sensor, and for brevity, may perhaps include only those portions of the signal that were used to sense the sensed feature of the particular physical entity. In that case, the metadata may include a description of the portion of the original signal segment that was stored.

The sensed signal may be any type of signal that is generated by a sensor. Examples include video, image, and audio signals. However, the variety of signals is not limited to those that can be sensed by a human being. For instance, the signal segment might represented a transformed version of the signal generated by the sensor to allow for human observations of better human focus. Such transformations might include filtering, such a filtering based on frequency, or quantization. Such transformation might also include amplification, frequency shifting, speed adjustment, magnifying, amplitude adjustment, and so forth.

In order to allow for reduction in storage requirements as well as proper focus on the signal of interest, perhaps only a portion of the signal segment is stored. For instance, if a video signal, perhaps only a portion of the frames of the video are stored. Furthermore, for any given image, perhaps only the relevant portion of the frame is stored. Likewise, if the sensor signal was an image, perhaps only the relevant portion of the image is stored. The recognition service that uses the signal segment to sense a feature is aware of which portion of the signal segment that was used to sense a feature. Accordingly, a recognition service can specifically carve out the relevant portion of the signal for any given sensed feature.

The computation component 250 may also have a security component 251 that may determine access to data with the sensed feature store 240. For instance, the security component 251 may control which users may access the sensed feature data 241 and/or the sensor signals 242. Furthermore, the security component 251 may even control which of the sensed feature data that computations are performed over, and/or which user are authorized to perform what type of computations or queries. Thus, security is effectively achieved. More regarding this security will be described below with respect to FIG. 6.

Since the sensed feature data represents the sensed features of the physical entities within the physical space 201 over time, complex computing may be performed on the physical entities within the physical space 201. As will be described below, for a user, it is as though the very environment itself is filled with helpful computing power that is getting ready for any computing query or computation regarding that physical space. This will be referred to hereinafter also as "ambient computing".

Furthermore, whenever a sensed feature is of interest, the evidence supporting that recognition components sensing of that feature may be reconstructed. For instance, the computing component 240 might provide video evidence of when a particular physical entity first entered a particular location. If multiple sensors generated sensor signals that were used by the recognition component to sense that feature, then the sensor signals for any individual sensor or combination of sensors may be reconstructed and evaluated. Thus, for instance, the video evidence of the physical entity first entering a particular location may be reviewed from different angles.

The physical space 201 is illustrated in FIG. 2 and is intended just to be an abstract representation of any physical space that has sensors in it. There are infinite examples of such physical spaces, but examples include a room, a house, a neighborhood, a factory, a stadium, a building, a floor, an office, a car, an airplane, a spacecraft, a Petri dish, a pipe or tube, the atmosphere, underground spaces, caves, land, combinations and/or portions thereof. The physical space 201 may be the entirety of the observable universe or any portion thereof so long as there are sensors capable of receiving signals emitted from, affected by (e.g., diffraction, frequency shifting, echoes, etc.), and/or reflected from the physical entities within the location.

The physical entities 210 within the physical space 201 are illustrated as including four physical entities 211, 212, 213 and 214 by way of example only. The ellipses 215 represent that there may be any number and variety of physical entities having features that are being sensed based on data from the sensors 220. The ellipses 215 also represent that physical entities may exit and enter the location 201. Thus, the number and identity of physical entities within the location 201 may change over time.

The position of the physical entities may also vary over time. Though the position of the physical entities is shown in the upper portion of the physical space 201 in FIG. 2, this is simply for purpose of clear labelling. The principles described herein are not dependent on any particular physical entity occupying any particular physical position within the physical space 201.

Lastly, for convention only and to distinguish physical entities 210 from the sensors 220, the physical entities 210 are illustrated as triangles and the sensors 220 are illustrated as circles. The physical entities 210 and the sensors 220 may, of course, have any physical shape or size. Physical entities typically are not triangular in shape, and sensors are typically not circular in shape. Furthermore, sensors 220 may observe physical entities within a physical space 201 without regard for whether or not those sensors 220 are physically located within that physical space 201.

The sensors 220 within the physical space 201 are illustrated as including two sensors 221 and 222 by way of example only. The ellipses 223 represent that there may be any number and variety of sensors that are capable of receiving signals emitted, affected (e.g., via diffraction, frequency shifting, echoes, etc.) and/or reflected by the physical entities within the physical space. The number and capability of operable sensors may change over time as sensors within the physical space are added, removed, upgrade, broken, replaced, and so forth.

Figure 3:
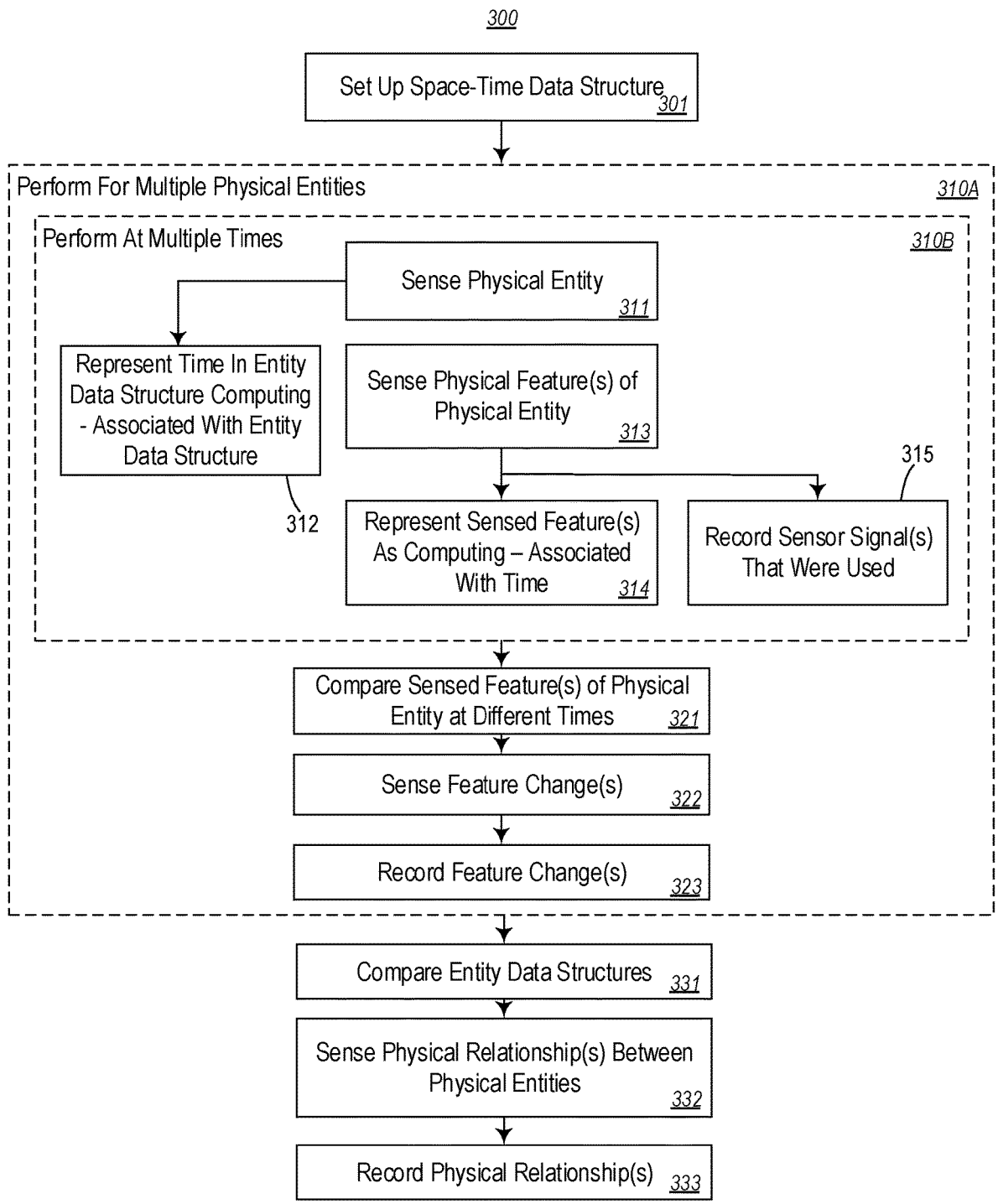
FIG. 3 illustrates a flowchart of a method for tracking physical entities within a location and may be performed in the environment of FIG. 2.
Figure 4:
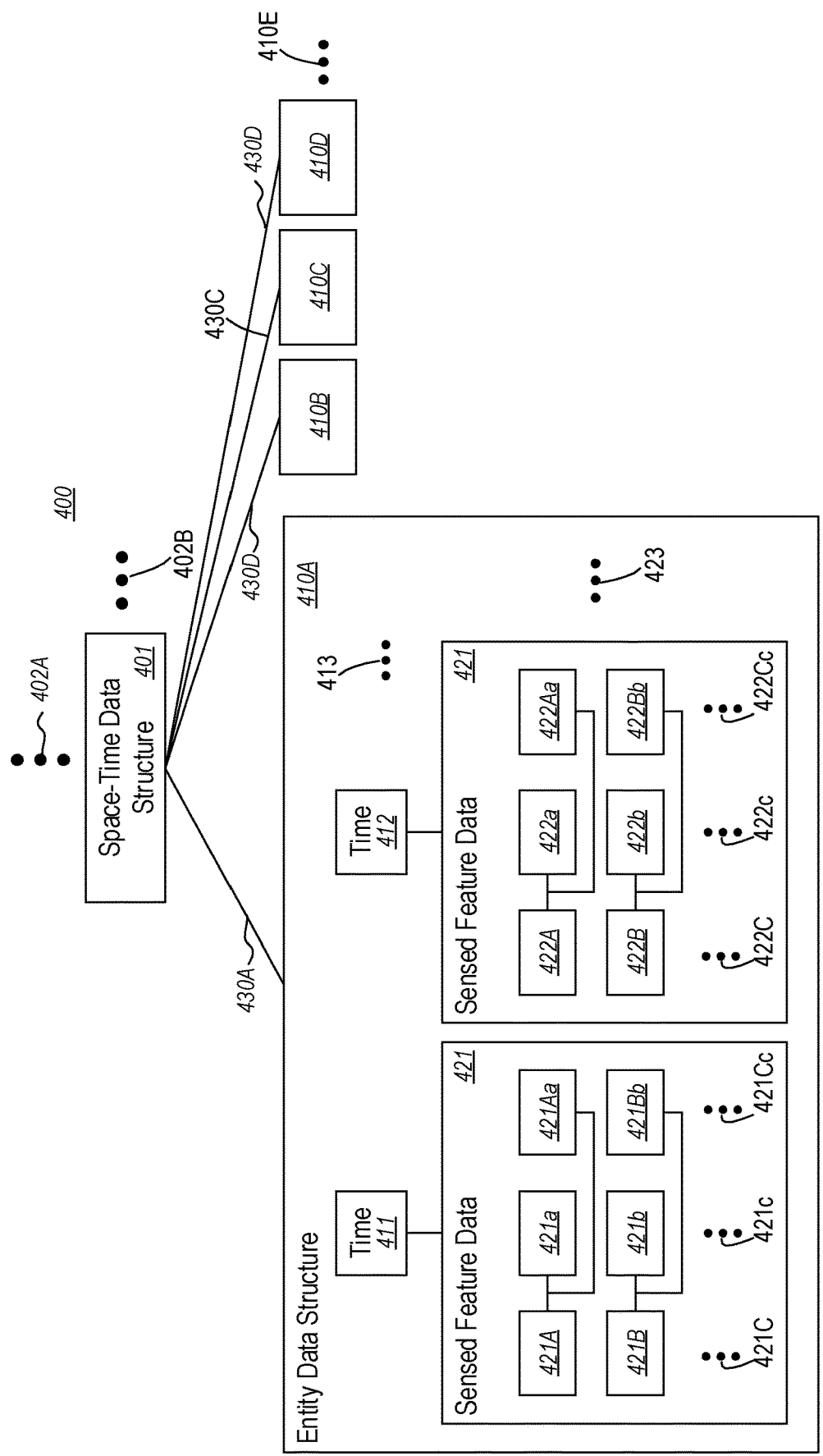
FIG. 4 illustrates an entity tracking data structure that may be used to assist in performing the method of FIG. 3, and which may be used to later perform queries on the tracked physical entities.

FIG. 3 illustrates a flowchart of a method 300 for tracking physical entities within a physical space. Since the method 300 may be performed to track the physical entities 210 within the physical space 201 of FIG. 2, the method 300 of FIG. 3 will now be described with frequent reference to the environment 200 of FIG. 2. Also, FIG. 4 illustrates an entity tracking data structure 400 that may be used to assist in performing the method 300, and which may be used to later perform queries on the tracked physical entities, and perhaps also to access and review the sensor signals associated with the tracked physical entities. Furthermore, the entity tracking data structure 400 may be stored in the sensed feature store 240 of FIG. 4 (which is represented as sensed feature data 241). Accordingly, the method 300 of FIG. 3 will also be described with frequent reference to the entity tracking data structure 400 of FIG. 4.

In order to assist with tracking, a space-time data structure for the physical space is set up (act 301). This may be a distributed data structure or a non-distributed data structure. FIG. 4 illustrates an example of an entity tracking data structure 400 that includes a space-time data structure 401. This entity tracking data structure 400 may be included within the sensed feature store 240 of FIG. 2 as sensed feature data 241. While the principles described herein are described with respect to tracking physical entities, and their sensed features and activities, the principles described herein may operate to tracking physical entities (and their sensed features and activities) within more than one location. In that case, perhaps the space-time data structure 401 is not the root node in the tree represented by the entity tracking data structure 400 (as symbolized by the ellipses 402A and 402B). Rather there may be multiple space-time data structures that may be interconnected via a common root node.

Then, returning to FIG. 3, the content of box 310A may be performed for each of multiple physical entities (e.g., physical entities 210) that are at least temporarily within a physical space (e.g., physical space 201). Furthermore, the content of box 310B is illustrated as being nested within box 310A, and represents that its content may be performed at each of multiple times for a given physical entity. By performing the method 300, a complex entity tracking data structure 400 may be created and grown, to thereby record the sensed features of physical entities that are one or more times within the location. Furthermore, the entity tracking data structure 400 may potentially also be used to access the sensed signals that resulted in certain sensed features (or feature changes) being recognized.

For a particular physical entity in the location at a particular time, a physical entity is sensed by one or more sensors (act 311). In other words, one or more physical signals emitted from, affected by (e.g., via diffraction, frequency shifting, echoes, etc.), and/or reflected from the physical entity is received by one or more of the sensors. Referring to FIG. 1, suppose that physical entity 211 has one or more features that are sensed by both sensors 221 and 222 at a particular time.

One aspect of security may enter at this point. The recognition component 230 may have a security component 231 that, according to particular settings, may refuse to record sensed features associated with particular physical entities, sensed features of a particular type, and/or that were sensed from sensor signals generated at particular time, or combinations thereof. For instance, perhaps the recognition component 230 will not record sensed features of any people that are within the location. As a more fine-grained examples, perhaps the recognition component 230 will not record sensed features of a set of people, where those sensed features relate to an identity or gender of the person, and where those sensed features resulted from sensor signals that were generated at particular time frames. More regarding this security will again be described below with respect to FIG. 6.

If permitted, an at least approximation of that particular time at which the physical entity was sensed is represented within an entity data structure that corresponds to the physical entity and this is computing-associated with the space-time data structure (act 312). For instance, referring to FIG. 4, the entity data structure 410A may correspond to the physical entity 211 and is computing-associated (as represented by line 430A) with the space-time data structure 401. In this description and in the claims, one node of a data structure is "computing-associated" with another node of a data structure if a computing system is, by whatever means, able to detect an association between the two nodes. For instance, the use of pointers is one mechanism for computing-association. A node of a data structure may also be computing-associated by being included within the other node of the data structure, and by any other mechanism recognized by a computing system as being an association.

The time data 411 represents an at least approximation of the time that the physical entity was sensed (at least at this time iteration of the content of box 310B) within the entity data structure 410A. The time may be a real time (e.g., expressed with respect to an atomic clock), or may be an artificial time. For instance, the artificial time may be a time that is offset from real-time and/or expressed in a different manner than real time (e.g., number of seconds or minutes since the last turn of the millennium). The artificial time may also be a logical time, such as a time that is expressed by a monotonically increasing number that increments at each sensing.

Also, based on the sensing of the particular physical entity at the particular time (at act 311), the environment senses at least one physical feature (and perhaps multiple) of the particular physical entity in which the particular physical entity exists at the particular time (act 313). For instance, referring to FIG. 2, the recognition component 230 may sense at least one physical feature of the physical entity 211 based on the signals received from the sensors 221 and 222 (e.g., as represented by arrow 229).

The sensed at least one physical feature of the particular physical entity is then represented in the entity data structure (act 314) in a manner computing-associated with the at least approximation of the particular time. For instance, in FIG. 2, the sensed feature data is provided (as represented by arrow 239) to the sensed feature store 240. In some embodiments, this sensed feature data may be provided along with the at least approximation of the particular time so as to modify the entity tracking data structure 400 in substantially one act. In other words, act 312 and act 314 may be performed at substantially the same time to reduce write operations into the sensed feature store 240.

Furthermore, if permitted, the sensor signal(s) that the recognition component relied upon to sense the sensed feature are recorded in a manner that is computer-associated with the sensed feature (act 315). For instance, the sensed feature that is in the sensed feature data 241 (e.g., in the space-time data structure 401) may be computing-associated with such sensor signal(s) stored in the sensed signal data 242.

Referring to FIG. 4, the first entity data structure now has sensed feature data 421 that is computing-associated with time 411. In this example, the sensed feature data 421 includes two sensed physical features 421A and 421B of the physical entity. However, the ellipses 421C represents that there may be any number of sensed features of the physical entity that is stored as part of the sensed feature data 421 within the entity data structure 401. For instance, there may be a single sensed feature, or innumerable sensed features, or any number in-between for any given physical entity as detected at any particular time.

In some cases, the sensed feature may be associated with other features. For instance, if the physical entity is a person, the feature might be a name of the person. That specifically identified person might have known characteristics based on features not represented within the entity data structure. For instance, the person might have a certain rank or position within an organization, have certain training, be a certain height, and so forth. The entity data structure may be extended by, when a particular feature is sensed (e.g., a name), pointing to additional features of that physical entity (e.g., rank, position, training, height) so as to even further extend the richness of querying and/or other computation on the data structure.

The sensed feature data may also have confidence levels associated with each sensed feature that represents an estimated probability that the physical entity really has the sensed feature at the particular time 410A. In this example, confidence level 421a is associated with sensed feature 421A and represents a confidence that the physical entity 211 really has the sensed feature 421A. Likewise, confidence level 421b is associated with sensed feature 421B and represents a confidence that the physical entity 211 really has the sensed feature 421B. The ellipses 421c again represents that there may be confidence levels expressed for any number of physical features. Furthermore, there may be some physical features for which there is no confidence level expressed (e.g., in the case where there is certainty or in case where it is not important or desirable to measure confidence of a sensed physical feature).

The sensed feature data may also have computing-association (e.g., a pointer) to the sensor signal(s) that were used by the recognition component to sense the sense feature of that confidence level. For instance, in FIG. 4, sensor signal(s) 421Aa is computing-associated with sensed feature 421A and represents the sensor signal(s) that were used to sense the sensed feature 421A at the time 411. Likewise, sensor signal(s) 421Bb is computing-associated with sensed feature 421B and represents the sensor signal(s) that were used to sense the sensed feature 421B at the time 411. The ellipses 421Cc again represents that there may be computing-associations of any number of physical features.

The security component 231 of the recognition component 230 may also exercise security in deciding whether or not to record sensor signal(s) that were used to sense particular features at particular times. Thus, the security component 231 may exercise security in 1) determining whether to record that particular features were sensed, 2) determining whether to record features associated with particular physical entities, 3) determining whether to record features sensed at particular times, 4) determining whether to record the sensor signal(s), and if so which signals, to record as evidence of a sensed feature, and so forth.

As an example, suppose that the location being tracked is a room. Now suppose that an image sensor (e.g., a camera) senses something within the room. An example sensed feature is that the "thing" is a human being. Another example sensed feature is that the "thing" is a particular named person. There might be a confidence level of 100 percent that the "thing" is a person, but only a 20 percent confidence level that the person is a specific identified person. In this case, the sensed feature set includes one feature that is a more specific type of another feature.

Furthermore, the image data from the camera may be pointed to by the record of the sensed feature of the particular physical entity at the particular time.

Another example feature is that the physical entity simply exists within the location, or at a particular position within the location. Another example is that this is the first appearance of the physical entity since a particular time (e.g., in recent times, or even ever). Another example of features is that the item is inanimate (e.g., with 99 percent certainty), a tool (e.g., with 80 percent certainty), and a hammer (e.g., with 60 percent certainty). Another example feature is that the physical entity is no longer present (e.g., is absent) from the location, or has a particular pose, is oriented in a certain way, or has a positional relationship with another physical entity within the location (e.g., "on the table" or "sitting in chair #5").

In any case, the number and types of features that can be sensed from the number and types of physical entities within any location is innumerable. Also, as previously mentioned, as represented by box 310B, the acts within box 310B may potentially be performed multiple times for any given physical entity. For instance, physical entity 211 may be against detected by one or both of sensors 221 and 222. Referring to FIG. 4, this detection results in the time of the next detection (or is approximation) to be represented within the entity data structure 410. For instance, time 412 is also represented within the entity data structure. Furthermore, sensed features 422 (e.g., including perhaps sensed feature 422A and 422B—with ellipses 422C again representing flexibility) are computing-associated with the second time 412. Furthermore, those sensed features may also have associated confidence levels (e.g., 422a, 422b, ellipses 422c). Likewise, those sensed features may also have associated sensor signals (e.g., 422Aa, 422Bb, ellipses 422Cc).

The sensed features sensed at the second time may be the same as or different than the sensed features sensed at the first time. The confidence levels may change over time. As an example, suppose a human being is detected at time #1 at one side of a large room via an image with 90 percent confidence, and that the human being is specifically sensed as being John Doe with 30 percent confidence. Now, at time #2 that is 0.1 seconds later, John Doe is sensed 50 feet away at another part of the room with 100 percent confidence, and there remains a human being at the same location where John Doe was speculated to be at time 1. Since human beings do not travel 50 feet in a tenth of a second (at least in an office setting), it can now be concluded that the human being detected at time 1 is not John Doe at all. So that confidence for time #1 that the human being is John Doe is reduced to zero.

Returning to FIG. 2, the ellipses 413 and 423 represent that there is no limit to the number of times that a physical entity may be detected within the location. As subsequent detections are made, more may be learned about the physical entity, and thus sensed features may be added (or removed) as appropriate, with corresponding adjustments to confidence levels for each sensed feature.

Now moving outside of box 310B, but remaining within box 310A, for any given physical entity, feature changes in the particular entity may be sensed (act 322) based on comparison (act 321) of the sensed feature(s) of the particular physical entity at different times. This sensed changes may be performed by the recognition component 230 or the computation component 250. If desired, those sensed changes may also be recorded (act 323). For instance, the sensed changes may be recorded in the entity data structure 410A in a manner that is, or perhaps is not, computing-associated with a particular time. Sensor signals evidencing the feature change may be reconstructed using the sensor signals that evidenced the sensed feature at each time.

For instance, based on a sensed feature at a first time being a presence of the physical entity within the location, and based on a second feature at a second time being an absence of the physical entity within the location, it can be concluded that the physical entity has exited the physical space. On the contrary, based on a sensed feature at a first time being an absence of the physical entity from the location, and a second feature at a second time being a presence of the physical entity within the location, it can be concluded that the physical entity has entered the location. In some case, perhaps absence from a physical space is not looked for in a physical entity until the physical entity is first detected as being present in the physical space.

Now referring to the box 310A, this tracking of feature(s) of physical entities may be performed for multiple entities over time. For instance, the content of box 310A may be performed for each of physical entities 211, 212, 213 or 214 within the physical space 201 or for other physical entities that enter or exit the physical space 201. Referring to FIG. 4, the space-time data structure 401 also is computing-associated (as represented by lines 430B, 430C, and 430D) with a second entity data structure 410B (perhaps associated with the second physical entity 212 of FIG. 2), a third entity data structure 410C (perhaps associated with the third physical entity 213 of FIG. 2); and a fourth entity data structure 410D (perhaps associated with the fourth physical entity 214 of FIG. 2).

The space-time data structure 401 may also include one or more triggers that define conditions and actions. When the conditions are met, corresponding actions are to occur. The triggers may be stored at any location in the space-time data structure. For instance, if the conditions are/or actions are with respect to a particular entity data structure, the trigger may be stored in the corresponding entity data structure. If the conditions and/or actions are with respect to a particular feature of a particular entity data structure, the trigger may be stored in the corresponding feature data structure.

The ellipses 410E represent that the number of entity data structures may change. For instance, if tracking data is kept forever with respect to physical entities that are ever within the physical space, then additional entity data structures may be added each time a new physical entity is detected within the location, and any given entity data structure may be augmented each time a physical entity is detected within the physical space. Recall, however, that garbage collection may be performed (e.g., by clean-up component 260) to keep the entity tracking data structure 400 from growing too large to be properly edited, stored and/or navigated.

Outside of the box 310A, physical relationships between different physical entities may be sensed (act 332) based on comparison of the associated entities data structures (act 331). Those physical relationships may likewise be recorded in the entity tracking data structure 401 (act 333) perhaps within the associated entity data structures that have the sensed physical relationships, and/or perhaps associated with the time that the physical entities are sensed as having the relationship. For instance, by analysis of the entity data structures for different physical entities through time, it might be determined that at a particular time, that a physical entity may be hidden behind another physical entity, or that a physical entity may be obscuring the sensing of another physical entity, or that two physical entities have been joined or that a physical entity has been detached to create multiple physical entities. Sensor signals evidencing the physical entity relationship may be reconstructed using the sensor signals that evidenced the sensed feature at the appropriate time and for each physical entity.

The feature data store 240 may now be used as a powerful store upon which to compute complex functions and queries over representations of physical entities over time within a physical space. Such computation and querying may be performed by the computation component 250. This enables enumerable numbers of helpful embodiments, and in fact introduces an entirely new form of computing referred to herein as "ambient computing". Within the physical space that has sensors, it is as though the very air itself can be used to compute and sense state about the physical world. It is as though a crystal ball has now been created for that physical space from which it is possible to query and/or compute many things about that location, and its history.

As an example, a user may now query whether an object is right now in a physical space, or where an object was at a particular time within the physical space. The user might also query which person having particular features (e.g., rank or position within a company) is near that object right now, and communicate with that person to bring the object to the user. The user might query as to relationships between physical entities. For instance, the user might query who has possession of an object. The user might query as to the state of an object, whether it is hidden, and what other object is obscuring view of the object. The user might query when a physical entity first appeared within the physical space, when they exited, and so forth. The user might also query when the lights were turned off, when the system became certain of one or more features of a physical entity. The user might also search on feature(s) of an object. The user might also query on activities that have occurred within the location. A user might compute the mean time that a physical entity of a particular type is within the location, anticipate where a physical entity will be at some future time, and so forth. Accordingly, rich computing and querying may be performed on a physical space that has sensors.

Figure 5:
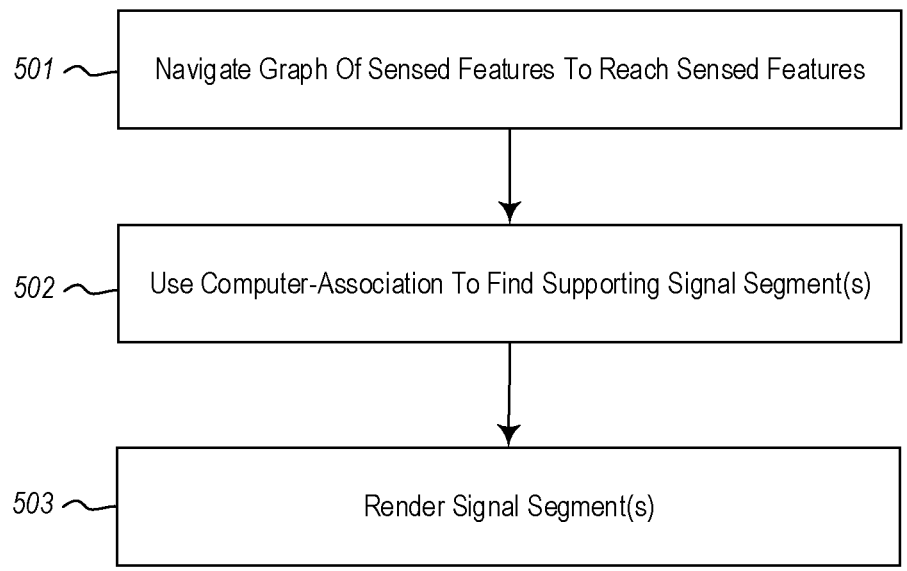
FIG. 5 illustrates a flowchart of a method for efficiently rendering signal segments of interest.

As previously mentioned, the computer-navigable graph may has signal segments associated with sensed features. FIG. 5 illustrates a flowchart of a method 500 for efficiently rendering signal segments of interest. First, the computing system navigates the navigable graph of sensed features to reach a particular sensed feature (act 501). For instance, this navigation may be performed automatic or in response to user input. The navigation may be the result of a calculation, or may simply involve identifying the sensed feature of interest. As another example, the navigation may be the result of a user query. In some embodiments, a calculation or query may result in multiple sensed features being navigated to. As an example, suppose that the computing system navigates to sensed feature 222A in FIG. 2.

The computing system then navigates to the sensed signal computer-associated with the particular sensed feature (act 502) using the computer-association between the particular sensed feature and the associated sensor signal. For instance, in FIG. 2, with the sensed feature being sensed feature 222A, the computer-association is used to navigate to the signal segment 222Aa.

Finally, the signal segment may then be rendered (act 503) on an appropriate output device. For instance, if the computing system is the computing system 100 of FIG. 1, the appropriate output device might be one or more of output mechanisms 112A. For instance, audio signals may be rendered using speakers, and visual data may be rendered using a display. After navigating to the sensed signal(s), multiple things could happen. The user might play a particular signal segment, or perhaps choose from multiple signal segments that contributed to the feature. A view could be synthesized from the multiple signal segments.

With computing being performed on the physical world, a new type of ambient computation is enabled. It is as though computers are available in the very ambient environment, embodied within the air itself, and able to perform computations on physical entities that were at any point in contact with that air. In the workplace, productivity may be greatly improved using this ambient computing. For instance, a user may quickly find a misplaced tool, or be able to communicate with a peer close to the tool so that the user can ask that peer to grab that tool and bring it to the user. Furthermore, in addition to ambient computing, human beings may review the sensor signal(s) that were used to sense features of interest for particular physical entities of interest, at particular times of interest. However, the number of scenarios for improving physical productivity by due to responsible use of ambient computing is limitless.

Figure 6:
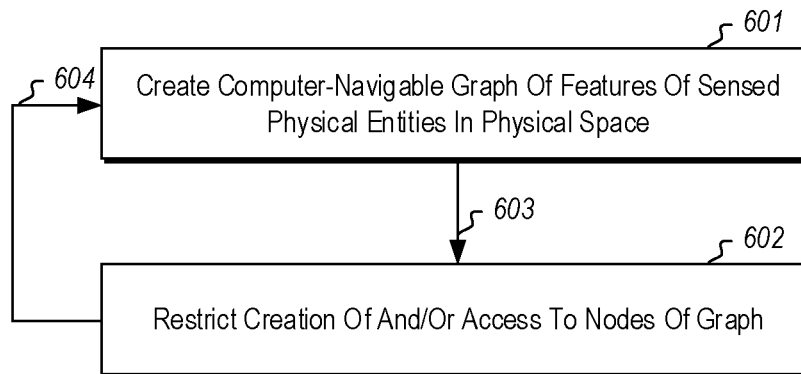
FIG. 6 illustrates a flowchart of a method for controlling creation of or access to information sensed by one or more sensors in a physical space.

Now that the principles of ambient computing have been described with respect to FIGS. 2 through 5, security mechanisms that may be performed in the context of such ambient computing will be described with respect to FIG. 6. FIG. 6 illustrates a flowchart of a method 600 for controlling creation of or access to information sensed by one or more sensors in a physical space. The method includes creating (act 601) a computer-navigable graph of features of sensed physical entities sensed in a physical space over time. The principles described herein are not limited to the precise structure of such a computer-navigable graph. An example structure and its creation have been described with respect to FIGS. 2 through 4.

The method 600 also includes restricting creation of or access to nodes of the computer-navigable graph based on one or more criteria (act 602). Thus, security is imposed upon the computer-navigable graph. The arrows 603 and 604 represent that the process of creating the graph and restrict creation/access to its nodes may be a continual process. The graph may be continuously have nodes added to (and perhaps removed from) the graph. Furthermore, restrictions of creation may be considered whenever there is a possibility of creation of a node. Restrictions of access may be decided when a node of the graph is created, or at any point thereafter. Examples of restrictions might include, for instance, a prospective identity of a sensed physical entity, a sensed feature of a sensed physical entity, and so forth.

In determining whether access to a node of a computer-navigable graph is authorized, there may be access criteria for each node. Such access criteria may be explicit or implicit. That is, if there is no access criteria explicit for the node that is to be accessed, then perhaps a default set of access criteria may apply. The access criteria for any given node may be organized in any manner. For instance, in one embodiment, the access criteria for a node may be stored with the node in the computer-navigable graph.

The access restrictions might also include restrictions based on a type of access requested. For instance, a computational access means that node is not directly accessed, but is used in a computation. Direct access to read the content of a node may be restricted, whilst computational access that does not report the exact contents of the node may be allowed.

Access restrictions may also be based on the type of node accessed. For instance, there may be a restriction in access to the particular entity data structure node of the computer-navigable graph. For instance, if that particular entity data structure node represents detections of a particular person in the physical space, access might be denied. There may also be restrictions in access to particular signal segment nodes of the computer-navigable graph. As an example, perhaps one may be able to determine that a person was in a location at a given time, but not be able to review video recordings of that person at that location. Access restrictions may also be based on who is the requester of access.

In determining whether to restrict creation of a particular sensed feature node of the computer-navigable graph, there may be a variety of criteria considered. For instance, there may be a restriction in creation of a particular signal segment node of a computer-navigable graph.

Figure 7:
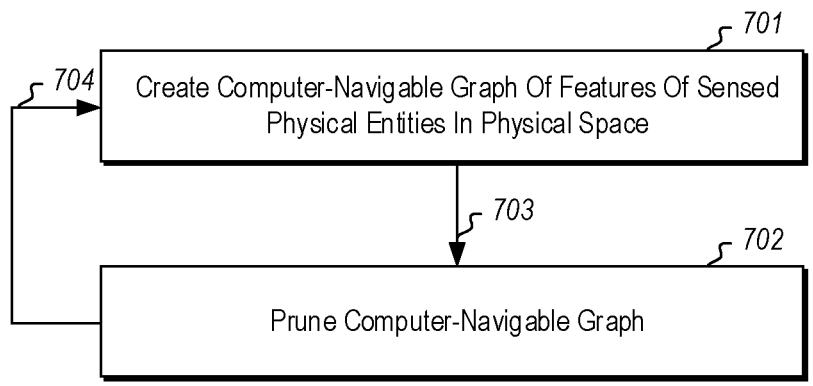
FIG. 7 illustrates a recurring flow showing that in addition to creating a computer-navigable graph of sensed features in the physical space, there may also be pruning of the computer-navigable graph to thereby keep the computer-navigable graph of the real world at a manageable size.

FIG. 7 illustrates a recurring flow 700 showing that in addition to creating a computer-navigable graph of sensed features in the physical space (act 701), there may also be pruning of the computer-navigable graph (act 702). These acts may even occur simultaneously and continuously (as represented by the arrows 703 and 704) to thereby keep the computer-navigable graph of sensed features at a manageable size. There has been significant description herein about how the computer-navigable graph may be created (represented as act 701).

Now, this description will focus on how the computer-navigable graph may be pruned to remove one or more nodes of the computer-navigable graph (act 702). Any node of the computer-navigable graph may be subject to removal. For instance, sensed features of a physical entity data structure may be removed for specific time or group of times. A sensed feature of a physical entity data structure may also be removed for all times. More than one sensed features of a physical entity data structure may be removed for any given time, or for any group of times. Furthermore, a physical entity data structure may be entirely removed in some cases.

The removal of a node may occur, for instance, when the physical graph represents something that is impossible given the laws of physics. For instance, a given object cannot be at two places at the same time, nor can that object travel significant distances in a short amount of time in an environment in which such travel is infeasible or impossible. Accordingly, if a physical entity is tracked with absolute certainty at one location, any physical entity data structure that represent with lesser confidence that the same physical entity is at an inconsistent location may be deleted.

The removal of a node may also occur when more confidence is obtained regarding a sensed feature of a physical entity. For instance, if a sensed feature of a physical entity within a location is determined with 100 percent certainty, then the certainty levels of that sensed feature of that physical entity may be updated to read 100 percent for all prior times also. Furthermore, sensed features that have been learned to not be applicable to a physical entity (i.e., the confidence level has reduced to zero or negligible), the sensed feature may be removed for that physical entity.

Furthermore, some information in the computer-navigable graph may simply be too stale to be useful. For instance, if a physical entity has not been observed in the physical space for a substantial period of time so as to make the prior recognition of the physical entity no longer relevant, then the entire physical entity data structure may be removed. Furthermore, detections of a physical entity that have become staled may be removed though the physical entity data structure remains to reflect more recent detections. Thus, cleansing (or pruning) of the computer-navigable graph may be performed via intrinsic analysis and/or via extrinsic information. This pruning intrinsically improves the quality of the information represented in the computer-navigable graph, by removing information of lesser quality, and freeing up space for more relevant information to be stored.

Accordingly, the principles described herein allow for a computer-navigable graph of the physical world. The physical graph may be searchable and queriable thereby allowing for searching and querying and other computations to be performed on the real world. Security may further be imposed in such an environment. Finally, the physical graph may be kept to a manageable size through cleansing and pruning. Thus, a new paradigm in computing has been achieved.

Figure 8:
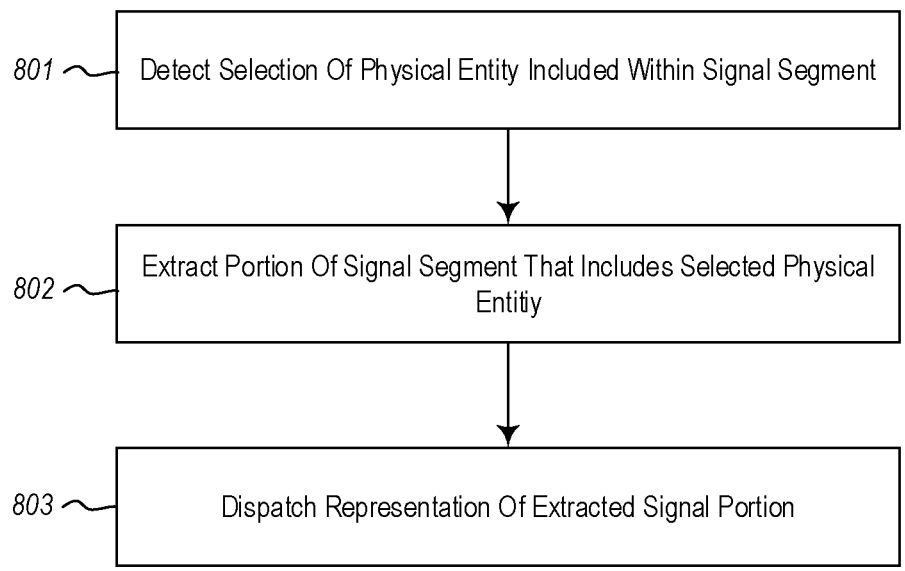
FIG. 8 illustrates a flowchart of a method for sharing at least a portion of a signal segment.

FIG. 8 illustrates a flowchart of a method 800 for sharing at least a portion of a signal segment. The signal segment might be, for instance, multiple signal segments that have captured the same physical entity. For instance, if the signal segment is a video signal segment, multiple video segments may have captured the same physical entity or entities from different perspectives and distances. If the signal is an audio signal segment, multiple audio segments may have been captured the selected physical entity or entities with different acoustic channels intervening between corresponding acoustic sensors and the selected physical entity or entities (or portions thereof). The signal segment(s) being shared may be a live signal segment that is capturing signals live from one or more physical entities within a location. Alternatively, the signal segment(s) being shared may be a recorded signal segment.

In accordance with the method 800, the system detects selection of one or more physical entities or portions thereof that is/are rendered within one or more signal segments (act 801). Thus, sharing may be initiated based on the semantic content of a signal segment. For instance, the selected physical entity or entities (or portion(s) thereof) may be the target of work or a source of work. As an example, the user might select a target of work such as a physical whiteboard. Another example target of work might be a piece of equipment that is being repaired. Examples of sources of work might be, for instance, a person writing on a physical whiteboard, a dancer, a magician, a construction worker, and so forth.

The individual that selected the physical entity or entities (or portions thereof) for sharing may be a human being. In that case, the user might select the physical entity or entities (or portions thereof) in any manner intuitive to a human user. Examples of such input include gestures. For instance, the user might circle an area that encompasses the physical entity or entities (or portions thereof) within a portion of a video or image signal segment.

Alternatively, the selection may be made by a system. For instance, the system might select that the portion of signal segments that includes particular physical entity or entities (or portions thereof) be shared upon detection of a particular condition, and/or in accordance with policy. For instance, as described below with respect to FIG. 10, the system might detect that a human actor is about to engage in a particular activity that requires training. The system might then select the physical entities or entities that are similar to a target of activity, or that include an individual as that individual has previously performed the activity, to share with the human actor. A narration of the activity may even be automatically generated and provide (as described with respect to FIG. 9).

The system then extracts portion(s) of the signal segment(s) in which the selected physical entity or selected portion of the physical entity is rendered (act 802). For instance, the signal segment might be multiple video signal segments.

The system might create a signal segment in which the point of view changes from one signal segment (generated by one sensor) to another signal segment (generated by another sensor) upon the occurrence of condition(s) that occur with respect to the selected physical entity or entities (or the selected portion there). For instance, suppose the selected physical entity is those portions of the whiteboard that an instructor is currently writing on. If the instructor's body was to obscure his own writing from the perspective of one sensor, another signal segment that captures the active portion of the whiteboard may be switched to automatically. The system may perform such switching (of live signal segments) or stitching (or recorded video segments) automatically.

The system then dispatches a representation of the signal segment(s) that encompasses the selected physical entity or entities (or portions there) to one or more recipients (act 803). Such recipients may be human beings, components, robotics, or any other entity capable of using the shared signal segment portion(s).

In one embodiment, the signal segments represents a portion of a physical graph that includes representations of physical entities sensed within a physical space, along with signal segments that evidence state of the physical entities. An example of such a physical graph has been described above with respect to FIGS. 2 through 4 with respect to the computer-navigable graph 400. The system could also dispatch a portion of the physical graph that relates to the signal segment portion(s) that are shared, and/or perhaps may extract information from that corresponding portion of the physical graph to share along with (or as an alternative to) the sharing of the signal segment portion(s) themselves.

Figure 9:
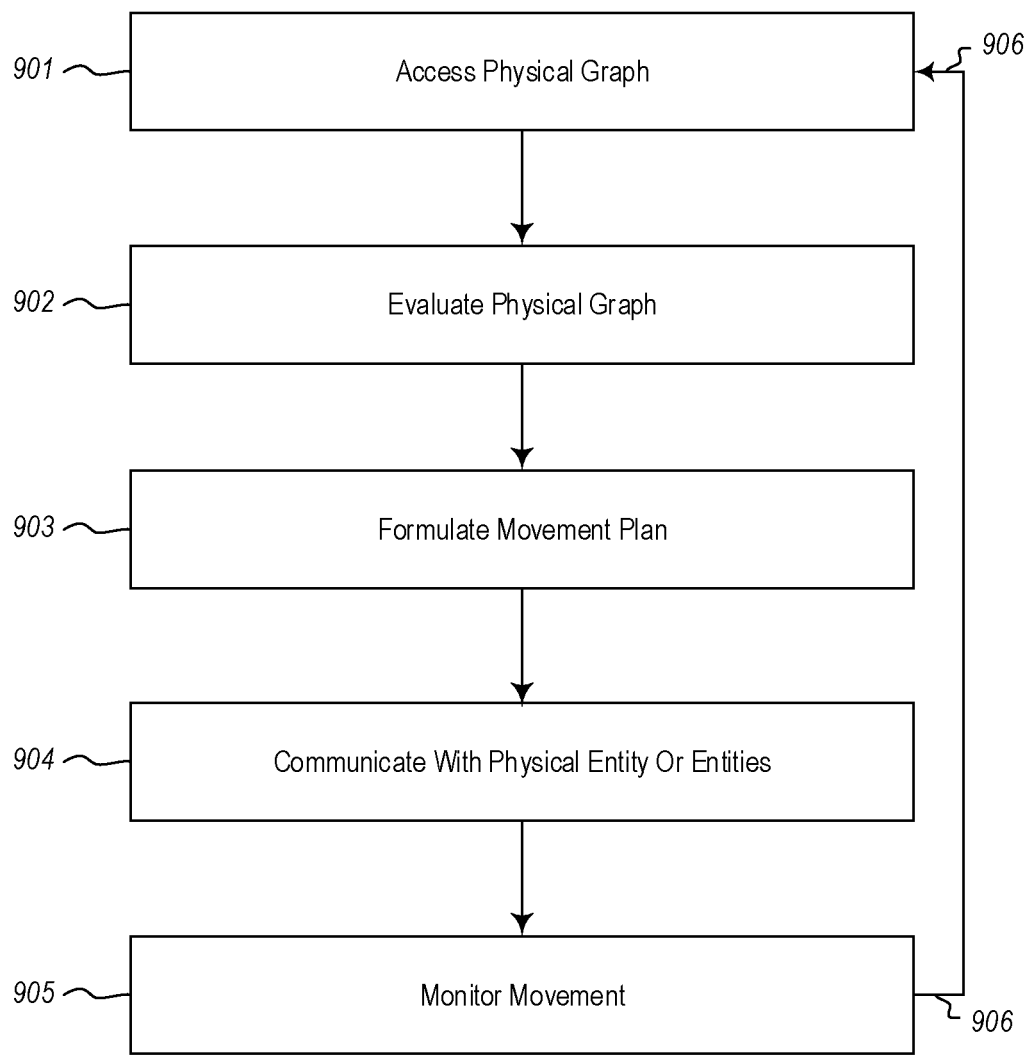
FIG. 9 illustrates flowchart of a method for formulating a plan for concurrent movement of a plurality of physical entities.
Figure 10:
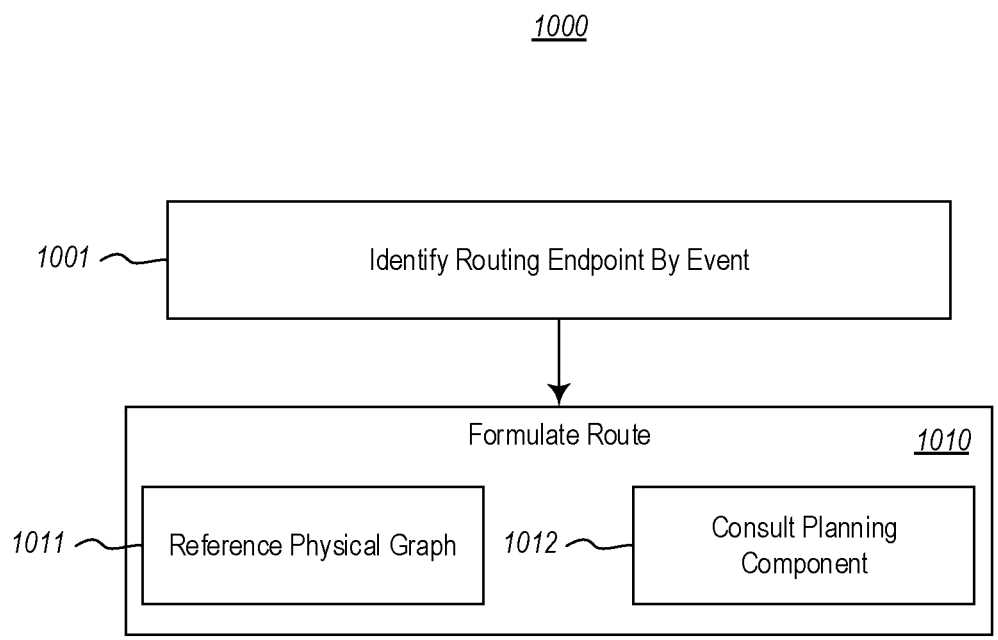
FIG. 10 illustrates a flowchart of a method for identifying a route for a physical entity to take within a physical space in order to go an event endpoint where even happened, is happening, or is predicted to happen.

The above-described computer-navigable physical graph of physical space enables a wide variety of applications and technical achievements. In particular, two of such achievements that are potentially related will now be described. One achievement described with respect to FIG. 9 is the overarching orchestration of movements of physical entities that are monitored within the physical space. Another achievement described with respect to FIG. 10 is the automatic routing of one physical entity to an event endpoint.

FIG. 9 illustrates a method 900 for formulating a plan for concurrent movement of physical entities. A physical graph is accessed (act 901), and evaluated (act 902). The movement plan that accomplishes one or more objectives is then performed (act 903) based on this evaluation. The physical graph represents presence and movement of physical entities within a physical space over time. An example of such a physical graph has been described above with respect to the computer-navigable graph of FIGS. 2 through 4.

The evaluation of the physical graph may take into consideration the physical constraints of the physical space and of the physical entities within that location. Physical constraints honor the laws of physics.

Examples of physical constraints of a physical space include a position of walls, whether a doorway is locked, or may be opened, whether there are any constrained channels of movement and the dimensions of such constrained channels, the presence of stairs, the position of any static obstacles to movement (such as chairs, and desks), whether there is lighting in different parts of the location. The three dimensional layout of physical space, where there are certain parts of the physical space that are off limits to humans, and so forth. For instance, if there is a physical channel through which at least some of the physical entities can move, the plan for movement might including sequencing of physical entities through the physical channel.

Examples of physical constraints on physical entities include whether the physical entity is child, adult, animal, or object; the maximum speed possible for the entity; the maximum safe speed for the entity; the dimensions of the entity, the optimal orientation of the entity; whether the entity can fly; the battery life (if applicable) of an object; the expense of operating an object; a movement priority of the entity; the sensory capabilities of the entity, and so forth. For instance, perhaps humans are given movement priority over drones and robots.

Examples of objectives of a movement plan include allowing a particular entity to move from one location to where an event is occurring, has occurred, or is predicted to occur. Such routing may be performed by the method 1000 of FIG. 10, as described further below. Each of multiple physical entities may have such a routing plan that is included as objectives of the overall orchestration of movement.

The evaluation may also consider constraints in interaction of at least some of the physical entities. For instance, heavy robots that cannot easily stop may be constrained by being at least a certain safe distance from surrounding adults, and an even greater safe distance from surrounding children. Drones may not be permitted to fly below a certain elevation when there are human beings present, and might be not be permitted to fly above a human being, or in such a way that if the drone stopped operating, the drone would not fall on the human being (taking momentum and gravity into consideration).

The evaluation may also consider which physical entities may be communicated with. For instance, some human beings in the physical space may receive navigation instructions. Other human beings might not be able to receive corrective movement instructions. Some robots and or drones may be in communication for orchestration of movements, and others might not. The plan of movement takes into consideration the ability of the various physical entities to communicate and the responsiveness to instructions, and gives priority to those entities that either cannot receive communications or cannot respond to communications to change course.

Referring back to FIG. 9, the orchestration may involve the system communicating with one or more of the physical entities to affect movement of at least one of the plurality of physical entities (act 904). When addressing a particular physical entity, rather than address by explicitly identifying the physical entity, addressing may occur by addressing the recipient by physical status. For instance, all housekeeping robots within 100 meters of a spill may be instructed to respond to a split. A system that has access to the physical graph may be able to specifically identify the physical entities based on this mere statement of physical status.

The communication may include an explicit instruction, or may include context from which the physical entity that was communicated with may infer an appropriate physical movement. Some physical entities may have intelligence to interpret the context, especially those that themselves have access to appropriate portions of the physical graph. For instance, the sharing of such context for purposes of a physical entity interpreting what movements to make may be one purpose for performing the method described above with respect to FIG. 8.

The system may then further monitor movements of the physical entities (act 905). If the situation changes (e.g., a physical entity is not following instructions, constraints are coming close to being violated, and so forth), the plan is adjusted as represented by the arrow 906. The monitoring of movements may occur via continual access to (act 901) and evaluation of (act 902) the physical graph, such that the formulation of a movement plan is updated (act 903) on a suitable timing basis to avoid constraints being violated whilst moving towards the objective(s) of the plan of movement.

FIG. 10 illustrates a flowchart of a method 1000 for identifying a route for a physical entity to take within a physical space in order to go to an event endpoint where an event happened, is happening, or is predicted to happen. The method 1000 may be performed for each of multiple physical entities.

The method 1000 is initiated by identifying an event that occurred, is occurring, or will occur (act 1001). The identified endpoint may be an activity (e.g., a spill, a congregating of other physical entities, a malfunction, or any other activity). The activity may be a past activity (e.g., "Take me to where the spill happened") a current activity (e.g., "Take me to where the spill is") or a predicted future activity (e.g., "Take me where people are predicted to congregate"). The identified endpoint may also be a physical entity that has a relationship with the activity (e.g., "Take me to the source of the spill", or "Take me to any person that was at the meeting").

The identified endpoint may also be a mobile physical entity or a group of mobile physical entities. Again, the event with respect to the mobile physical entities may a past event (e.g., "Take me to where any customer fell in the last 24 hours"), a current event (e.g., "Take me to where a customer is") or a future event (e.g., "Route me to rendezvous with my boss"). Again, the physical entity or group of physical entities may be addressed by current or prior or expected future physical status, without specifically identifying the physical entity (e.g., "Route me to rendezvous with any person that is heading to the conference").

The system then formulates a route that moves a particular physical entity from a current location to a location of the identified event within the physical space (act 1010). If the predicted location of an event changes, re-routing may occur. For instance, if the user is being taken to any person on their way to the conference, the target person may make an unexpected detour. The system may re-route to a different rendezvous point, or may search for another close person also heading to the conference, and re-route accordingly. This re-routing may occur on a frequent basis. For instance, people may walk faster or slower than expected, may make detours, or may simply choose a path not expected. Such may result in the original route no longer being feasible.

The formulation of the route may occur by referencing the physical graph described above (act 1011). This allows for routing to be intelligently performed automatically based on semantic understanding of what is actually happening (or what actually happened) in the physical space. The routing may occur in coordination with a planning component that plans movement of a plurality of physical entities within the physical space (act 1012). Such a planning component may, for instance, be performing the method 900 of FIG. 9. By so coordinating, the system reduces disruption caused by any given routing to the overall orchestration of movement.

Accordingly, the principles described herein provide for effective and automated movement and routing of physical entities within a physical space. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed:

1. A computing system comprising:
   one or more processors;
   one or more computer-readable media having thereon computer-executable instructions that are structured such that, when executed by the one or more processors, cause the computing system to perform a method for formulating a plan for concurrent movement of a plurality of physical entities, the method comprising:
   accessing a physical graph, the physical graph comprising information representing both location and movement of the plurality of physical entities within a physical space over time, the physical graph being part of a sensed feature store comprising a plurality of signal segments, each signal segment comprising a signal detected by a sensor from at least one of the plurality of physical entities located within the physical space, each signal segment associated with a time when the signal of the at least one physical entity was detected, the sensed feature store also storing a plurality of sensed features associated with the plurality of physical entities, each sensed feature also associated with a time and location within the physical space, the sensed feature store also storing a plurality of physical relationships of the plurality of physical entities determined by a comparison of data structures representing the plurality of physical entities within the sensed feature store;
   evaluating the physical graph, physical constraints of the physical space, physical constraints of the plurality of physical entities sensed within the physical space, and one or more objectives for the plurality of physical entities to accomplish within the physical space; and
   based on the evaluation, formulating a plan for movement of the plurality of physical entities that complies with the physical constraints of the physical space, complies with the physical constraints of the plurality of physical entities, complies with the physical relationships of the plurality of physical entities and that accomplishes at least one of the one or more objectives.

2. The computing system in accordance with claim 1, the evaluation also considering movement priority for each of at least one of the plurality of physical entities.

3. The computing system in accordance with claim 1, the evaluation also considering constraints in interaction of at least some of the plurality of physical entities.

4. The computing system in accordance with claim 3, the constraints in interaction comprising safety constraints.

5. The computing system in accordance with claim 3, the constraints in interaction comprising law of physics constraints.

6. The computing system in accordance with claim 1, the evaluation also considering which of the plurality of physical entities can be communicated with, the plan for movement providing instructions for movement around predicted movement of one or more physical entities that cannot be communicated with.

7. The computing system in accordance with claim 6, the evaluation also considering which of the plurality of physical entities are predicted to honor instructions for movement, the plan for movement providing instructions for movement around predicted movement of one or more physical entities that cannot be communicated with and one or more physical entities that are not predicted to honor instructions for movement.

8. The computing system in accordance with claim 6, the evaluation considering which of the plurality of physical entities are predicted to honor instructions for movement, the plan for movement providing instructions for movement around predicted movement of one or more physical entities that are not predicted to honor instructions for movement.

9. The computing system in accordance with claim 1, the method further comprising:
communicating with one or more of the plurality of physical entities to affect movement of at least one of the plurality of physical entities.

10. The computing system in accordance with claim 9, addressing of the communication occurring by physical status rather than by explicitly identifying the one or more of the plurality of physical entities that are to be communicated with.

11. The computing system in accordance with claim 9, the communication comprising explicit instructions.

12. The computing system in accordance with claim 9, the communication comprising context from which the physical entity that was communicated with may infer an appropriate physical movement.

13. The computing system in accordance with claim 9, the method further comprising:
further monitoring movement of the plurality of physical entities.

14. The computing system in accordance with claim 13, the method being repeatedly performed in order to dynamically adjust the plan for movement based on the further monitoring of the movement of the plurality of physical entities.

15. The computing system in accordance with claim 1, a constraint of the physical space comprising a physical channel through which at least some of the physical entities can move, the plan for moving comprising sequencing of physical entities through the physical channel.

16. The computing system in accordance with claim 1, the one or more objectives including at least one routing objective expressed by a particular physical entity.

17. The computing system in accordance with claim 1, a physical constraint for a particular physical entity comprising space needed for the particular physical entity.

18. The computing system in accordance with claim 1, a physical constraint for a particular physical entity comprising movement capability for the particular physical entity.

19. A method for formulating a plan for concurrent movement of a plurality of physical entities, the method comprising:
accessing a physical graph, the physical graph comprising information representing both location and movement of the plurality of physical entities within a physical space over time, the physical graph being part of a sensed feature store comprising a plurality of signal segments, each signal segment comprising a signal detected by a sensor from at least one of the plurality of physical entities located within the physical space, each signal segment associated with a time when the signal of the at least one physical entity was detected, the sensed feature store also storing a plurality of sensed features associated with the plurality of physical entities, each sensed feature also associated with a time and location within the physical space, the sensed feature store also storing a plurality of physical relationships of the plurality of physical entities determined by a comparison of data structures representing the plurality of physical entities within the sensed feature store;
evaluating the physical graph, physical constraints of the physical space, physical constraints of the plurality of physical entities sensed within the physical space, and one or more objectives for the plurality of physical entities to accomplish within the physical space; and
based on the evaluation, formulating a plan for movement of the plurality of physical entities that complies with the physical constraints of the physical space, complies with the physical constraints of the plurality of physical entities, complies with the physical relationships of the plurality of physical entities, and that accomplishes at least one of the one or more objectives.

20. A computer program product comprising one or more computer-readable storage devices having thereon computer-executable instructions that are structured such that, when executed by the one or more processors, cause the computing system to perform a method for formulating a plan for concurrent movement of a plurality of physical entities, the method comprising:
accessing a physical graph, the physical graph comprising information representing both location and movement of the plurality of physical entities within a physical space over time, the physical graph being part of a sensed feature store comprising a plurality of signal segments, each signal segment comprising a signal detected by a sensor from at least one of the plurality of physical entities located within the physical space, each signal segment associated with a time when the signal of the at least one physical entity was detected, the sensed feature store also storing a plurality of sensed features associated with the plurality of physical entities, each sensed feature also associated with a time and location within the physical space, the sensed feature store also storing a plurality of physical relationships of the plurality of physical entities determined by a comparison of data structures representing the plurality of physical entities within the sensed feature store;
evaluating the physical graph, physical constraints of the physical space, physical constraints of the plurality of physical entities sensed within the physical space, and one or more objectives for the plurality of physical entities to accomplish within the physical space; and
based on the evaluation, formulating a plan for movement of the plurality of physical entities that complies with the physical constraints of the physical space, complies with the physical constraints of the plurality of physical entities, complies with the physical relationships of the plurality of physical entities, and that accomplishes at least one of the one or more objectives.

* * * * *